United States Patent
Kim et al.

(10) Patent No.: US 10,228,790 B2
(45) Date of Patent: Mar. 12, 2019

(54) DISPLAY DEVICE

(71) Applicant: Samsung Display Co., Ltd., Yongin-si, Gyeonggi-do (KR)

(72) Inventors: Min Soo Kim, Yongin-si (KR); Mu Gyeom Kim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 13 days.

(21) Appl. No.: 15/605,755

(22) Filed: May 25, 2017

(65) Prior Publication Data
US 2018/0120987 A1    May 3, 2018

(30) Foreign Application Priority Data

Nov. 2, 2016 (KR) .................. 10-2016-0145140

(51) Int. Cl.
*G06F 3/041* (2006.01)
*G06F 3/044* (2006.01)
*H01L 27/32* (2006.01)

(52) U.S. Cl.
CPC ........... *G06F 3/0412* (2013.01); *G06F 3/044* (2013.01); *H01L 27/323* (2013.01); *H01L 27/3276* (2013.01); *G06F 2203/04102* (2013.01); *G06F 2203/04103* (2013.01)

(58) Field of Classification Search
CPC ............. G06F 3/0412; G06F 3/044; G06F 2203/04103; G06F 2203/04102; H01L 27/3276; H01L 27/323
See application file for complete search history.

(56) References Cited

U.S. PATENT DOCUMENTS

| | | | |
|---|---|---|---|
| 8,259,089 B2 | 9/2012 | Lee et al. | |
| 8,946,690 B2 | 2/2015 | Lee et al. | |
| 9,196,876 B2 | 11/2015 | Lee et al. | |
| 2011/0012845 A1* | 1/2011 | Rothkopf | G06F 3/044 |
| | | | 345/173 |
| 2013/0194759 A1* | 8/2013 | Kang | H05K 1/181 |
| | | | 361/748 |

(Continued)

FOREIGN PATENT DOCUMENTS

| | | |
|---|---|---|
| KR | 10-1450256 | 10/2014 |
| KR | 10-2015-0116985 A | 10/2015 |

(Continued)

*Primary Examiner* — Koosha Sharifi-Tafreshi
(74) *Attorney, Agent, or Firm* — Lewis Roca Rothgerber Christie LLP

(57) ABSTRACT

A display device includes a first substrate and a second substrate. The first substrate includes a first base substrate, a drive layer, and an optical layer, and is divided into a display area, and a non-display area. A first connection pad and a second connection pad are disposed in the non-display area. The second substrate is disposed facing the first substrate, and includes: a second base substrate including a sensing area, and a non-sensing area; and a touch sensor disposed on the second base substrate. The touch sensor includes a touch sensing electrode, a touch pad, and a sensing line electrically coupling the touch sensing electrode with the touch pad. The non-display area of the first substrate is bent so that the first connection pad is electrically coupled with the second connection pad, and the second connection pad is electrically coupled with the touch pad.

26 Claims, 13 Drawing Sheets

(56) References Cited

U.S. PATENT DOCUMENTS

2015/0286325 A1* 10/2015 Kim .................. G06F 3/044
                                                        345/174
2016/0306460 A1   10/2016 Lee et al.

FOREIGN PATENT DOCUMENTS

| KR | 10-2016-0017338 A | 2/2016 |
| KR | 10-2016-0123437 A | 10/2016 |

* cited by examiner

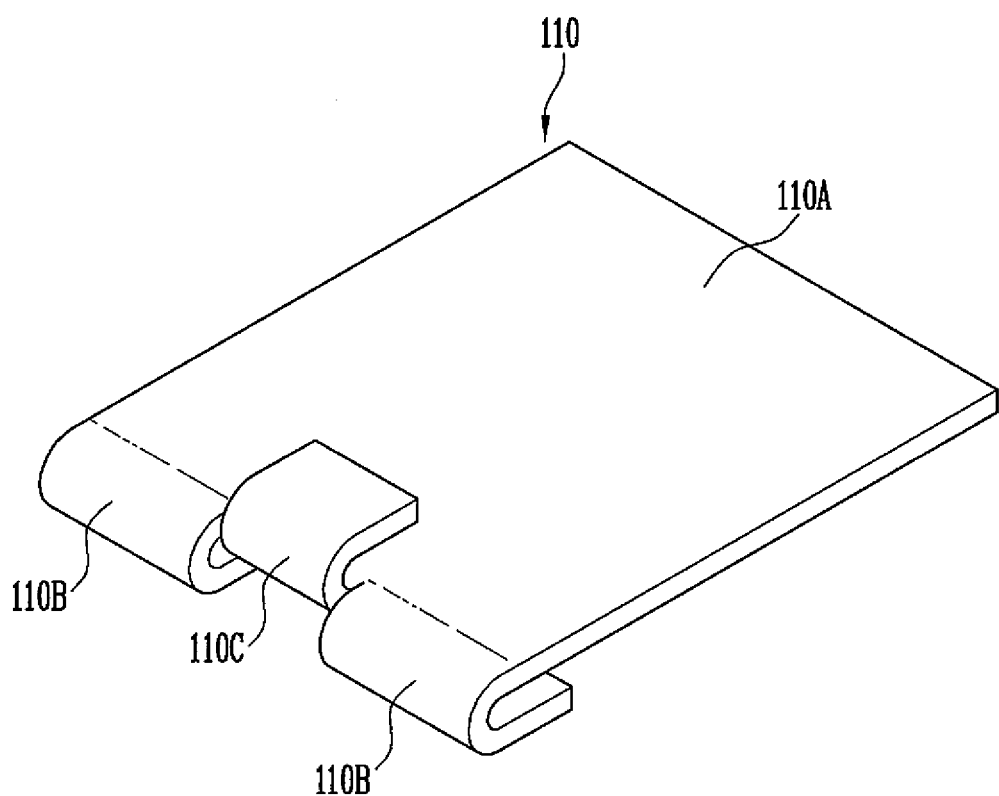

DISPLAY DEVICE

CROSS-REFERENCE TO RELATED APPLICATION

The application claims priority to and the benefit of Korean patent application No. 10-2016-0145140, filed on Nov. 2, 2016, in the Korean Intellectual Property Office, the entire content of which is incorporated herein by reference.

BACKGROUND

1. Field

Various embodiments of the present disclosure relate to a display device.

2. Description of the Related Art

Recently, a display device has been developed with the aim of having an information input function as well as an image display function. The information input function of the display device may be generally embodied in the form of a touch screen, which is configured to receive touches of a user. The touch screen may be attached to one surface of a display panel which embodies the image display function, or may be integrally formed with the display panel.

In the display device provided with the touch screen, the touch screen is disposed at a position spaced apart from a substrate of the display panel, for example, a substrate on which a signal input terminal is disposed. For this, in the display device, the touch screen and the signal input terminal may be electrically coupled to each other by an ACF (Anisotropic conductive film) including a conductive ball.

The size of the conductive ball may correspond to the distance between the touch screen and the substrate. Therefore, the size of the conductive ball may be increased. As the size of the conductive ball is increased, the deviation in size of the conductive ball may be increased. The deviation in size of the conductive ball may cause contact failure between the touch screen and the signal input terminal.

SUMMARY

Various embodiments of the present disclosure are directed to a display device which may prevent failure from occurring due to the deviation in size of a conductive ball (or which may reduce a likelihood or degree of such failure).

One embodiment of the present disclosure provides a display device including: a first substrate comprising a first base substrate, a drive layer provided on the first base substrate, and an optical layer disposed on the drive layer and provided with a display element, the first substrate being divided into a display area including a pixel area, and a non-display area disposed adjacent to the display area, with a first connection pad and a second connection pad disposed in the non-display area; and a second substrate facing the first substrate, and comprising: a second base substrate including a sensing area corresponding to the display area, and a non-sensing area corresponding to the non-display area; and a touch sensor disposed on the second base substrate, wherein the touch sensor comprises a touch sensing electrode disposed in the sensing area, a touch pad disposed in the non-sensing area, and a sensing line electrically coupling the touch sensing electrode with the touch pad, and wherein the non-display area of the first substrate is bent so that the first connection pad and the second connection pad are electrically coupled with each other, and the second connection pad is electrically coupled with the touch pad.

In an embodiment, the second connection pad may include: a first pattern provided on a surface of the first base substrate on which the first connection pad is disposed; a second pattern provided in a through hole passing through the first base plate, and coupled with the first pattern; and a third pattern provided on a surface of the first base substrate that is opposite to the surface thereof on which the first pattern is provided, the third pattern being coupled with the second pattern.

In an embodiment, when the first substrate is bent, the first pattern may face the first connection pad, and the third pattern may face the touch pad.

In an embodiment, the display device may further include: a conductive ball disposed between the first pattern and the first connection pad.

In an embodiment, the display device may further include: a conductive ball disposed between the third pattern and the touch pad.

In an embodiment, the size of the conductive ball disposed between the first pattern and the first connection pad may be equal to or greater than the size of the conductive ball disposed between the third pattern and the touch pad.

In an embodiment, the size of the conductive ball disposed between the third pattern and the touch pad may be equal to or greater than the size of the conductive ball disposed between the first pattern and the first connection pad.

In an embodiment, the display device may further include: a conductive adhesive layer disposed between the first pattern and the first connection pad.

In an embodiment, the conductive adhesive layer may include conductive paste.

In an embodiment, the first pattern and the first connection pad may come into direct contact with each other.

In an embodiment, the display device may further include: a conductive adhesive layer disposed between the third pattern and the touch pad.

In an embodiment, the third pattern and the touch pad may come into direct contact with each other.

In an embodiment, the second connection pad may include: a first pattern having a shape extending from the first connection pad; a second pattern provided in a through hole passing through the first base plate, and coupled with the first pattern; and a third pattern provided on a surface of the first base substrate that is opposite to a surface thereof on which the first pattern is provided, the third pattern being coupled with the second pattern.

In an embodiment, the display device may further include: an elastic member disposed between the first pattern and the first connection pad, and configured to maintain a bent shape of the first substrate.

In an embodiment, before the first substrate is bent, the first connection pad and the second connection pad may be spaced apart from each other.

In an embodiment, the first connection pad may be disposed between the display area and the second connection pad.

In an embodiment, the first substrate may include: a flat area; at least one first bent area extended and bent from one side of the flat area; and at least one second bent area spaced apart from the first bent area and bent in a direction different from a direction in which the first bent area is bent.

In an embodiment, the second connection pad may be provided in the first bent area.

In an embodiment, the first substrate may include one first bent area, and two second bent areas spaced apart from each other, and the first bent area may be disposed between the second bent areas.

In an embodiment, the first substrate may include two first bent areas spaced apart from each other, and one second bent area, and the second bent area may be disposed between the first bent areas.

In an embodiment, the first connection pad may be provided in the flat area.

In an embodiment, the display device may further include: an adhesion layer provided on the first substrate and the second substrate and configured to adhere the first substrate and the second substrate to each other.

In an embodiment, the display device may further include: an insulating layer disposed between the second base substrate and the touch sensor.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 22-23 are perspective views illustrating bent shapes of the first substrate.

DETAILED DESCRIPTION

Figure 1:
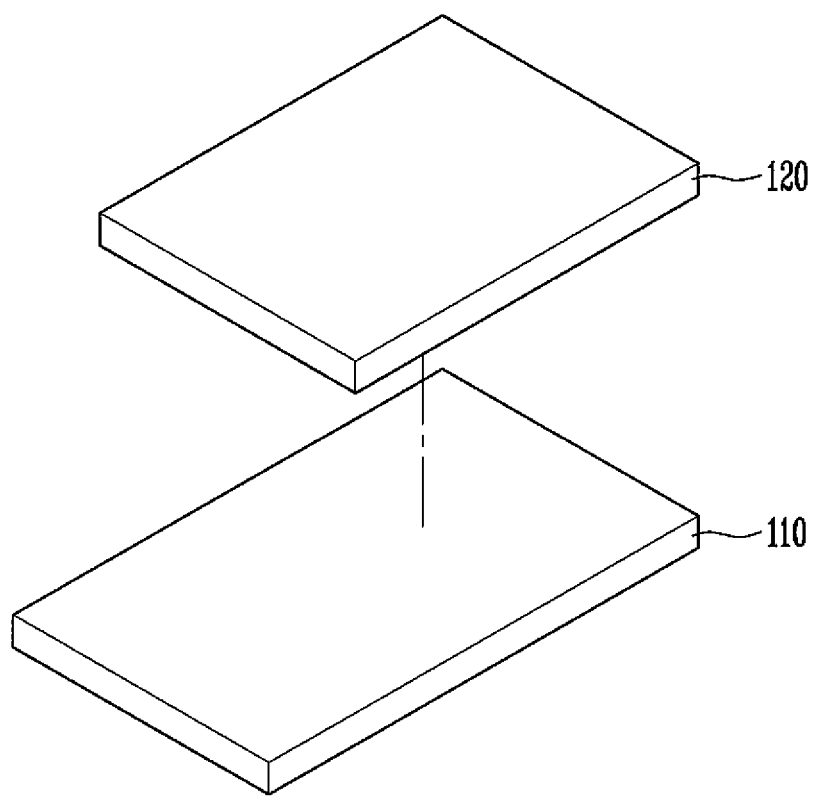
FIG. 1 is a perspective view illustrating a display device in accordance with an embodiment of the present disclosure.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, may be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural form, unless the context clearly indicates otherwise. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and, unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Embodiments of the present disclosure will hereinafter be described in more detail with reference to the accompanying drawings.

Figure 2:
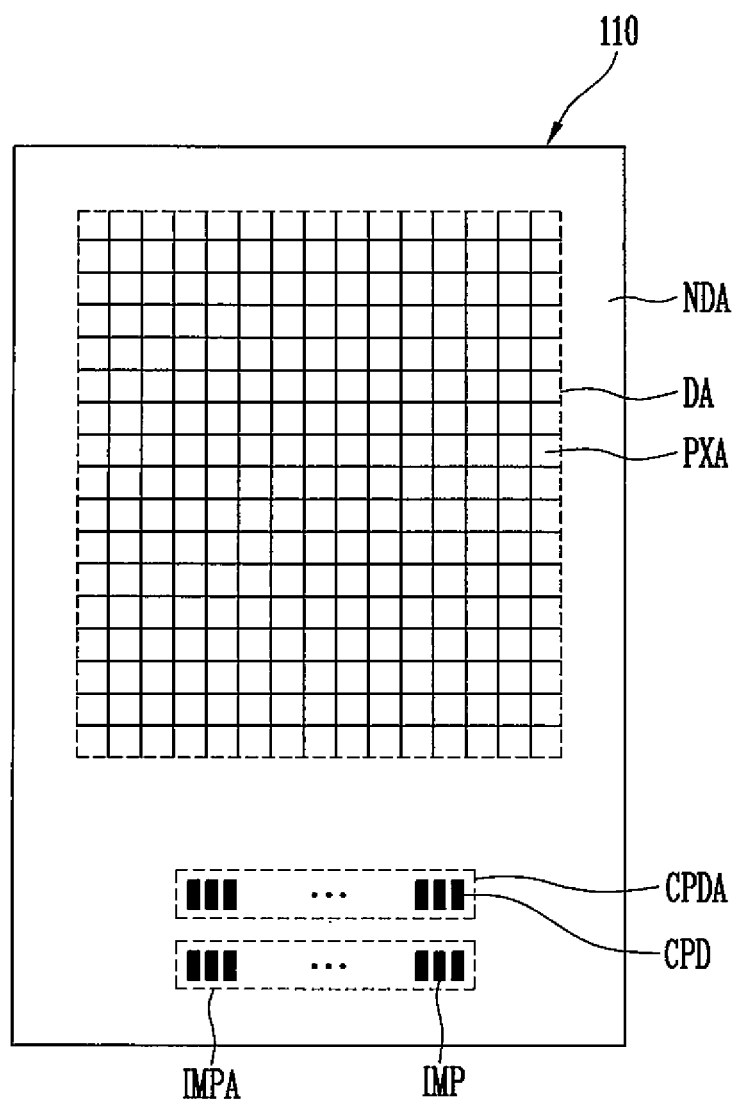
FIG. 2 is a plan view illustrating the display panel of FIG. 1.
Figure 3:
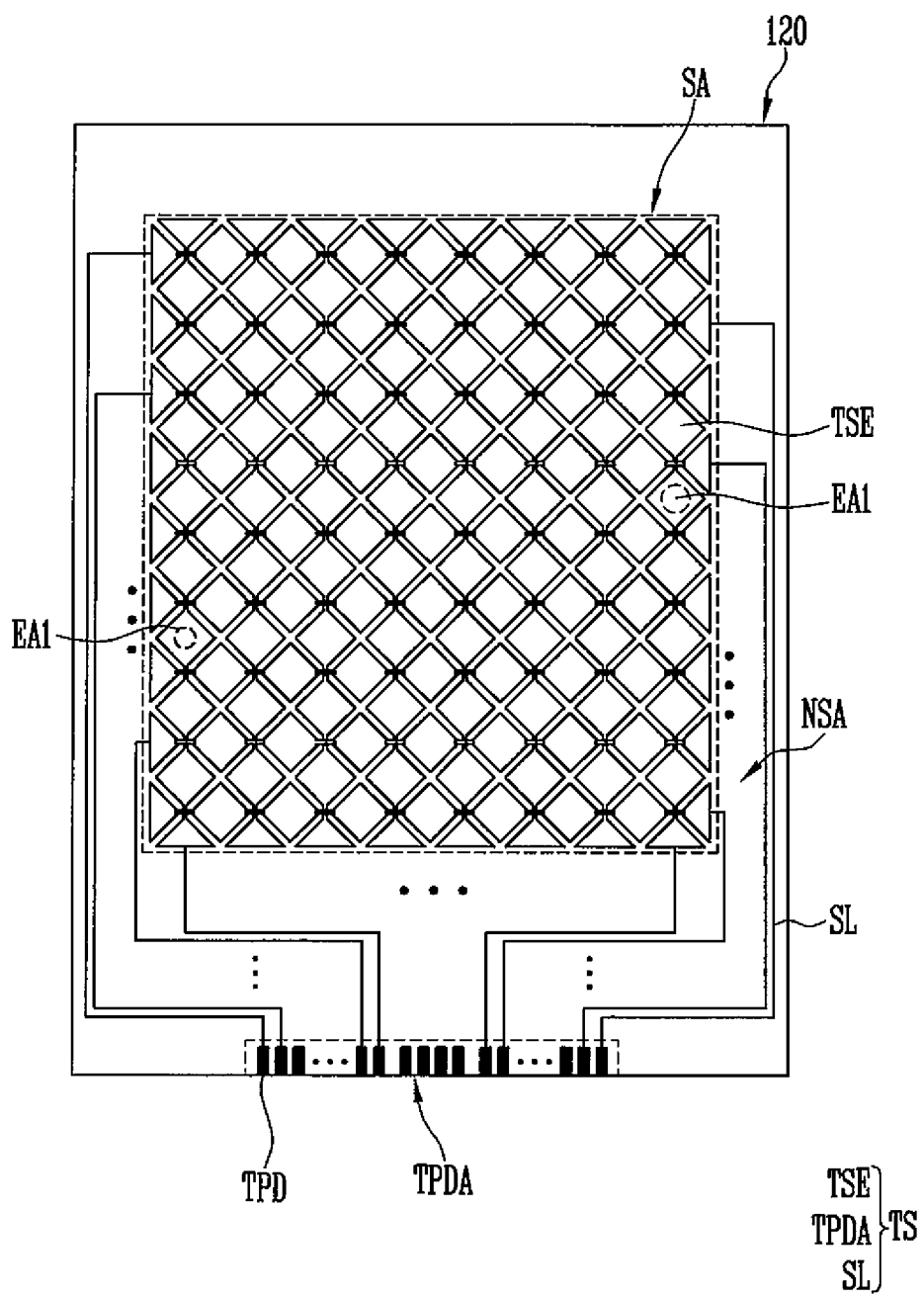
FIGS. 3-4 are plan views illustrating a touch sensor of FIG. 1.
Figure 4:
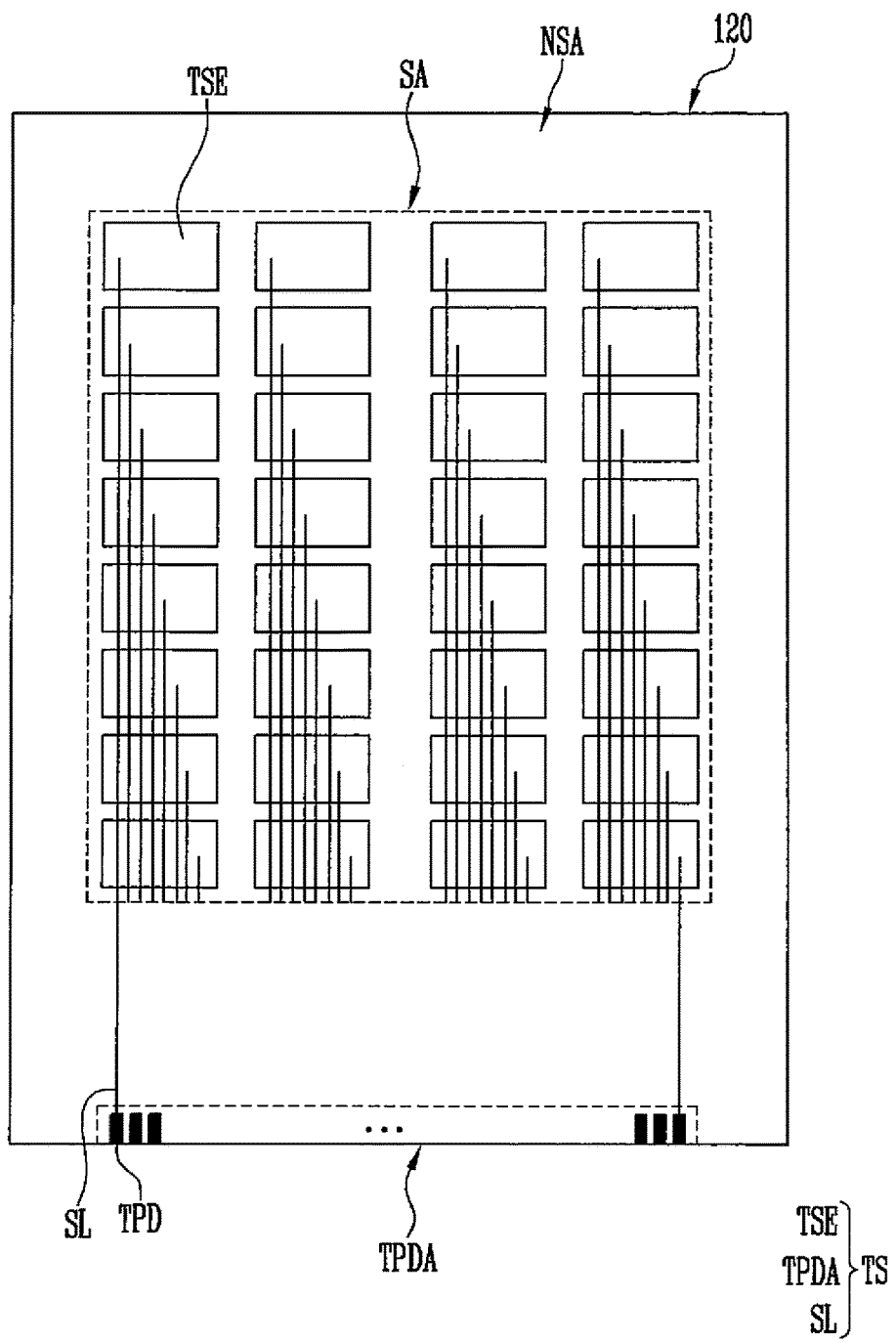
Figure 5:
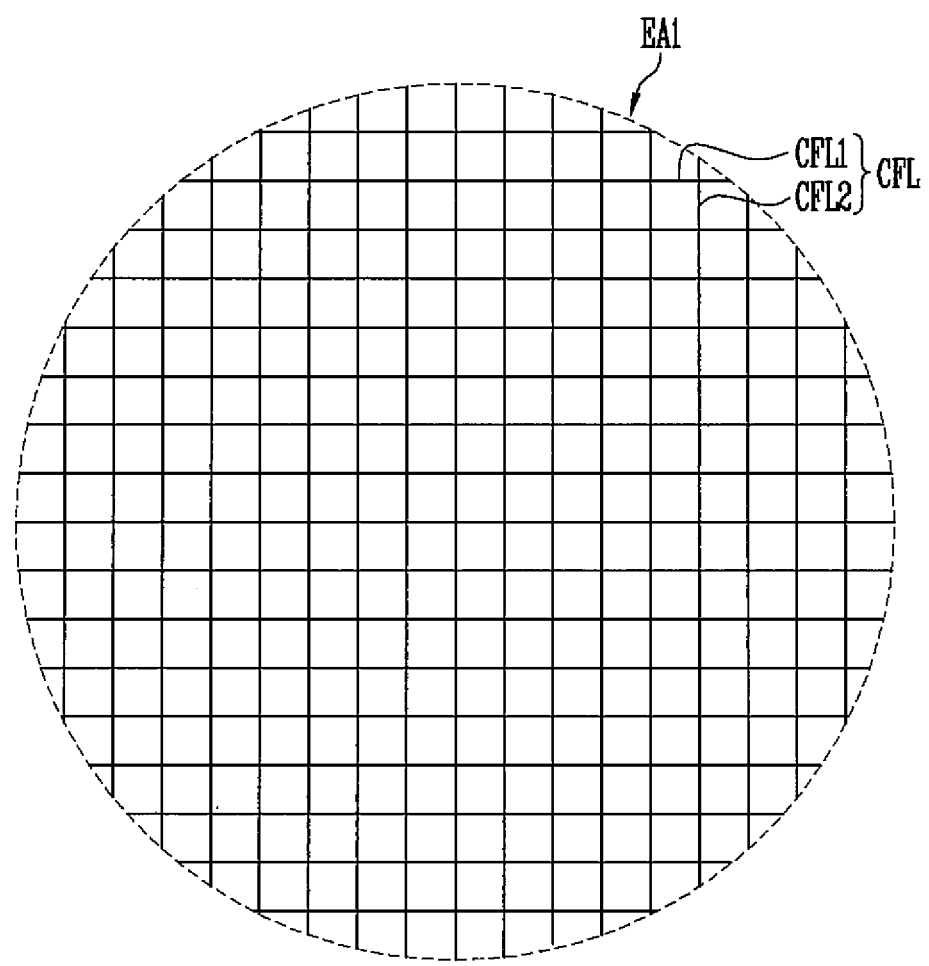
FIG. 5 is an enlarged view of area EA1 of FIG. 3.

FIG. 1 is a perspective view illustrating a display device in accordance with an embodiment of the present disclosure. FIG. 2 is a plan view illustrating the display panel of FIG. 1. FIGS. 3-4 are plan views illustrating a touch sensor of FIG. 1. FIG. 5 is an enlarged view of area EA1 of FIG. 3.

Referring to FIGS. 1-5, the display device may include a first substrate 110, and a second substrate 120 that faces the first substrate 110.

The first substrate 110 may include a display area DA and a non-display area NDA.

The display area DA may be provided with a plurality of pixel areas PXA. Furthermore, the display area DA may be a plurality of gate lines, and a plurality of data lines that intersect the gate lines. Each of the pixel areas PXA may include at least one thin film transistor which is coupled with one of the gate lines and one of the data lines, and a display element which is coupled with the thin film transistor.

The display element may be formed of any one selected from an LCD (liquid crystal display) element, an EPD (electrophoretic display) element, an EWD (electrowetting display) element, and an OLED (organic light emitting display) element. In the following description, for the sake of explanation, the OLED element will be described as an example of the display element.

The display element may include a first electrode which is coupled to the thin film transistor, a light-emitting layer which is disposed on the first electrode, and a second electrode which is disposed on the light-emitting layer. The light-emitting layer may generate light by recombination between electrons and holes that are injected through the first electrode and the second electrode.

The non-display area NDA may be disposed adjacent to the display area DA. For example, the non-display area NDA may be provided around the display area DA to have a shape in which the non-display area NDA encloses the display area DA. On portion of the non-display area NDA, there may be provided a first connection pad area CPDA on which a plurality of first connection pads CPD are disposed, and a second connection pad area IMPA on which a plurality of second connection pads IMP are disposed. The first connection pad area CPDA and the second connection pad area IMPA may be disposed at positions spaced apart from each other. Furthermore, one selected from the first and second connection pad areas CPDA and IMPA, for example, the first connection pad area CPDA, may be disposed between the display area DA and the other one. One selected from the first and second connection pads CPD and IMP may be electrically coupled with the other.

The second substrate 120 may be provided with a touch sensor TS. Furthermore, the second substrate 120 may include a sensing area SA and a non-sensing area NSA. The sensing area SA may correspond to the display area DA of the first substrate 110. The non-sensing area NSA may be disposed adjacent to the sensing area SA. The non-sensing area NSA may correspond to the non-display area NDA of the first substrate 110.

The touch sensor TS may be provided on one surface of the second substrate 120.

The touch sensor TS may include a plurality of touch sensing electrodes TSE, a touch pad area TPDA including a plurality of touch pads TPD, and sensing lines SL that couple the touch sensing electrodes TSE with the touch pads TPD.

The touch sensing electrodes TSE may be disposed in the sensing area SA. The touch sensing electrodes TSE may be arranged in various suitable shapes depending on a touch sensing method of the touch sensor TS.

For example, as shown in FIG. 3, the touch sensing method of the touch sensor TS may correspond to a mutual capacitance touch sensor type (or kind). In this case, some of the touch sensing electrodes TSE may form a plurality of touch sensing electrode rows, which are parallel (or substantially parallel) with each other, and in each of which touch sensing electrodes are coupled to each other in one direction. Furthermore, the other touch sensing electrodes TSE may form a plurality of touch sensing electrode columns, which are parallel (or substantially parallel) with each other, and in each of which touch sensing electrodes are coupled to each other in a direction intersecting the touch sensing electrode rows. The touch sensing electrode rows and the touch sensing electrode rows may be coupled to the respective touch pads TPD of the touch pad area TPDA through the sensing lines SL.

As shown in FIG. 4, the touch sensing method of the touch sensor TS may correspond to a self capacitance touch sensor type (or kind). In this regard, the touch sensing electrodes TSE may be arranged in a matrix shape. The touch sensing electrodes TSE may be coupled to the respective touch pads TPD of the touch pad area TPDA through the sensing lines SL.

The touch sensing electrodes TSE may include conductive material. For example, each of the touch sensing electrodes TSE may include at least one transparent conductive oxide selected from ITO (Indium Tin Oxide), IZO (Indium Zinc Oxide), AZO (Aluminum Zinc Oxide), GZO (gallium doped zinc oxide), ZTO (zinc tin oxide), GTO (Gallium tin oxide) and FTO (fluorine doped tin oxide).

As shown in FIG. 5, the touch sensing electrodes TSE may include a plurality of conductive fine lines CFL. For example, the touch sensing electrodes TSE may include a plurality of first conductive fine lines CFL1 which extend in one direction and are parallel (or substantially parallel) with each other, and a plurality of conductive fine lines CFL2 which extend in a direction intersecting the first conductive fine lines CFL1 and are parallel (or substantially parallel) with each other. In some embodiments, the touch sensing electrodes may have a mesh structure. The mesh structure may be suitable for embodying a bendable, foldable or rollable flexible touch sensor.

The first conductive fine lines CFL1 and the second conductive fine lines CFL2 may include low-resistance metal. For example, each of the first and second conductive fine lines CFL1 and CFL2 may include at least one selected from gold (Au), silver (Ag), copper (Cu), molybdenum (Mo), aluminum, palladium, neodymium, and a silver-palladium-copper (APC) alloy.

The touch pads TPD and the sensing lines SL may be provided in the non-sensing area NSA.

Each of the touch pads TPD may be electrically coupled with a corresponding one selected from the first and second connection pads CPD and OMP. Therefore, the touch pads TPD may apply touch drive signals supplied from the outside, to the touch sensor TS through the first connection pads CPD and the second connection pads IMP, and transmit touch sensing signals sensed by the touch sensor TS, to the outside.

Figure 6:
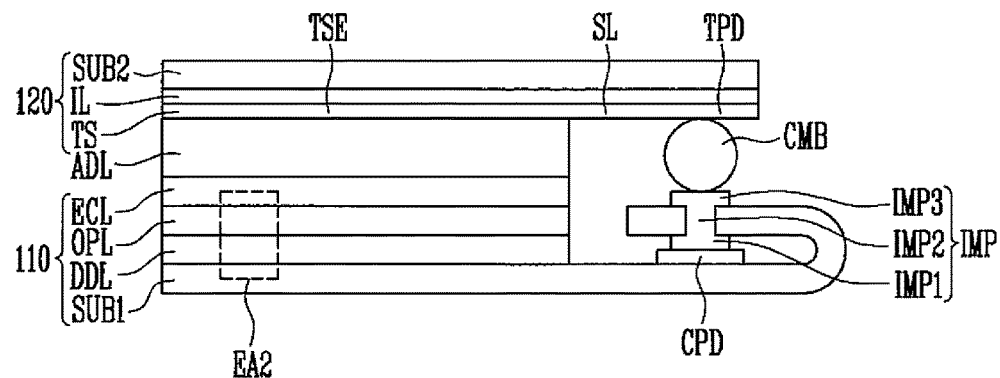
FIG. 6 is a partial sectional view illustrating the display device shown in FIGS. 1-5.
Figure 7:
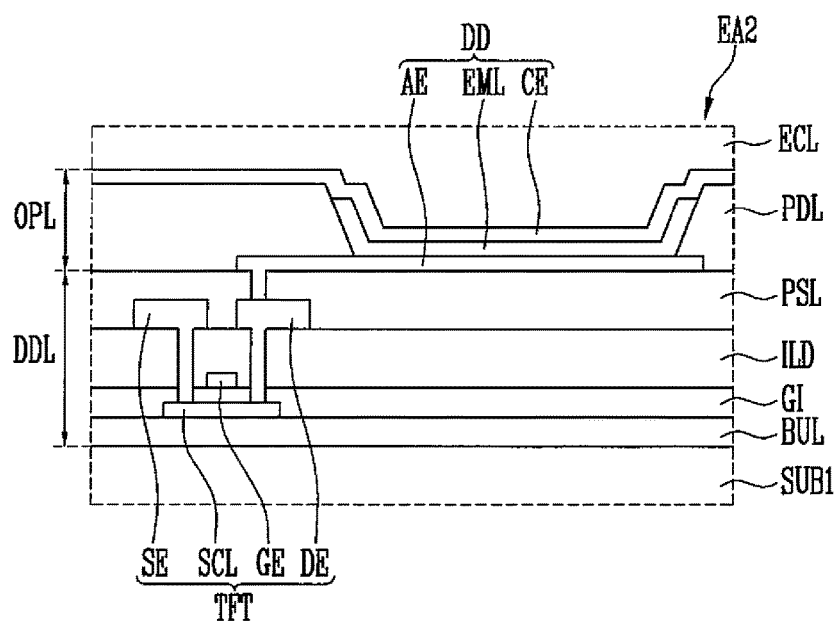
FIG. 7 is an enlarged view of area EA2 of FIG. 6.

FIG. 6 is a partial sectional view illustrating the display device shown in FIGS. 1-5. FIG. 7 is an enlarged view of area EA2 of FIG. 6.

Referring to FIGS. 1-7, the display device may include the first substrate 110, the second substrate 120 that faces the first substrate 110, and an adhesion layer ADL that adheres the first substrate 110 and the second substrate 120 to each other.

The first substrate 110 may include a first base substrate SUB1, a drive layer DDL which is provided on the first base substrate SUB1, an optical layer OPL which is provided on the drive layer DDL, and a encapsulating layer ECL which is provided on the optical layer OPL.

The first base substrate SUB1 may include a display area DA and a non-display area NDA. The display area DA may be provided with a plurality of pixel areas PXA. The non-display area NDA may be disposed adjacent to the display area DA.

The first base substrate SUB1 may include transparent insulating material and allow light to pass therethrough. Furthermore, the first base substrate SUB1 may be formed of a flexible substrate. The flexible substrate may include a film substrate or a plastic substrate that includes polymer organic material. For example, the flexible substrate may include at least one selected from PES (polyethersulfone), polyacrylate, PEI (polyetherimide), PEN (polyethylene naphthalate), PET (polyethylene terephthalate), PPS (polyphenylene sulfide), PAR (polyarylate), PI (polyimide), PC (polycarbonate), TAC (triacetate cellulose), and CAP (cellulose acetate propionate). Furthermore, the flexible substrate may include FRP (fiber glass reinforced plastic).

In an embodiment, the material applied to the first base substrate SUB1 may have resistance (thermal resistance) to high treatment temperatures during a process of manufacturing the display device.

The drive layer DDL may be provided on the first base substrate SUB1 and include at least one thin film transistor TFT provided in each pixel area PXA. Furthermore, the drive layer DDL may include a buffer layer BUL that is provided between the first base substrate SUB1 and the thin film transistor TFT. The buffer layer BUL may include inorganic insulating material. For example, the buffer layer BUL may include at least one selected from silicon oxide, silicon nitride, and silicon oxynitride. Furthermore, the buffer layer BUL may have a single-layer structure or a multilayer structure. For example, the buffer layer BUL may have a single-layer structure including any one selected from silicon oxide, silicon nitride, and silicon oxynitride. The buffer layer BUL may include a first insulating layer including silicon oxide, and a second insulating layer that is disposed on the first insulating layer and includes silicon nitride. The buffer layer BUL may include three or more insulating layers that are successively stacked.

The buffer layer BUL may prevent impurities from diffusing from the first base substrate SUB1 to the thin film transistor TFT (or such diffusion of impurities may be reduced). Furthermore, the buffer layer BUL may planarize the surface of the first base substrate SUB1.

The thin film transistor TFT may be coupled to a gate line and a data line. The thin film transistor TFT may include a semiconductor layer SCL, a gate electrode GE, a source electrode SE, and a drain electrode DE.

The semiconductor layer SCL may be disposed on the buffer layer BUL. The semiconductor layer SCL may include any one selected from amorphous silicon (Si), poly crystalline silicon (Si), an oxide semiconductor, and an organic semiconductor. Areas on the semiconductor layer SCL that are coupled to the source electrode SE and the drain electrode DE may be a source area and a drain area with or into which impurities have been doped or injected. An area between the source area and the drain area may be a channel area.

In some embodiments, if the semiconductor layer SCL includes an oxide semiconductor, a light blocking layer may be disposed on or under the semiconductor layer SCL so as to block light from being incident on the semiconductor layer SCL.

A gate insulating layer GI may be disposed on the semiconductor layer SCL. The gate insulating layer GI may cover the semiconductor layer SCL and insulate the semiconductor layer SCL from the gate electrode GE. The gate insulating layer GI may include at least one selected from organic insulating material and inorganic insulating material. For example, the gate insulating layer GI may include at least one selected from silicon oxide and silicon nitride.

The gate electrode GE may be disposed on the gate insulating layer GI. The gate electrode GE may be coupled to the gate line. The gate electrode GE may include low-resistance conductive material and overlap the semiconductor layer SCL.

An interlayer insulating layer ILD may be disposed on the gate electrode GE. The interlayer insulating layer ILD may include at least one selected from organic insulating material and inorganic insulating material. For example, the interlayer insulating layer ILD may include at least one selected from silicon oxide and silicon nitride. The interlayer insulating layer ILD may insulate the source electrode SE, the drain electrode DE and the gate electrode GE from each other.

Contact holes that pass through the gate insulating layer GI and the interlayer insulating layer ILD may expose the source area and the drain area of the semiconductor layer SCL.

The source electrode SE and the drain electrode DE may be disposed on the interlayer insulating layer ILD at positions spaced apart from each other. Each of the source electrode SE and the drain electrode DE may include low-resistance conductive material. A first end of the source electrode SE may be coupled to the data line. A second end of the source electrode SE may be coupled to the source area through one of the contact holes. A first end of the drain electrode DE may be coupled to the drain area through another one of the contact holes. A second end of the drain electrode DE may be coupled to a display element DD.

In the present embodiment, there has been illustrated the case where the thin film transistor TFT is a thin film transistor having a top gate structure, but the present disclosure is not limited to this. For example, the thin film transistor TFT may be a thin film transistor having a bottom gate structure.

The drive layer DDL may include a protective layer PSL for covering the thin film transistor TFT. The protective layer PSL may be provided on the first base substrate SUB1 on which the thin film transistor TFT has been disposed. A portion of the protective layer PSL is removed to expose one selected from the source electrode SE and the drain electrode, for example, to expose the drain electrode DE.

The protective layer PSL may include at least one layer. For example, the protective layer PSL may include an inorganic protective layer, and an organic protective layer disposed on the inorganic protective layer. The inorganic protective layer may include at least one selected from silicon oxide and silicon nitride. The organic protective layer may include at least one selected from acryl, PI (polyimide), PA (polyamide) and BCB (benzocyclobutene). Furthermore, the organic protective layer may be a planarization layer that is transparent and flexible and thus makes it possible to mitigate unevenness of a lower structure and planarize the lower structure.

The optical layer OPL may be provided on the protective layer PSL and include the display element DD that is coupled to the drain electrode DE.

The display element DD may include a first electrode AE which is coupled to the drain electrode DE, a light-emitting layer EML which is disposed on the first electrode AE, and a second electrode CE which is disposed on the light-emitting layer EML.

Any one selected from the first electrode AE and the second electrode CE may be an anode electrode, and the other one may be a cathode electrode. For example, the first electrode AE may be an anode electrode, and the second electrode CE may be a cathode electrode.

Furthermore, at least one selected from the first electrode AE and the second electrode CE may be a transmitting electrode. For example, in the case where the display element DD is a back emitting type (or kind of) organic light-emitting element, the first electrode AE may be a transmitting electrode, and the second electrode CE may be a reflective electrode. In the case where the display element DD is a front emitting type (or kind of) organic light-emitting element, the first electrode may be a reflective electrode, and the second electrode may be a transmitting electrode. In the case where the display element DD is a both-side emitting type (or kind of) organic light-emitting element, both the first electrode and the second electrode may be transmitting electrodes. In the present embodiment, there is illustrated the case where the display element DD is a front emitting type (or kind of) organic light emitting element and the first electrode AE is an anode electrode.

In each pixel area, the first electrode AE may be disposed on the protective layer PSL. The first electrode AE may include a reflective layer which reflects light, and a transparent conductive layer which is disposed on or under the reflective layer. At least one selected from the transparent conductive layer and the reflective layer may be coupled with the drain electrode DE.

The reflective layer may include material that is able to reflect light. For example, the reflective layer may include at least one selected from aluminum (Al), silver (Ag), chrome (Cr), molybdenum (Mo), platinum (Pt), nickel (Ni) and an alloy of them.

The transparent conductive layer may include transparent conductive oxide. For example, the transparent conductive layer may include at least one transparent conductive oxide selected from ITO (Indium Tin Oxide), IZO (Indium Zinc Oxide), AZO (Aluminum Zinc Oxide), GZO (gallium doped zinc oxide), ZTO (zinc tin oxide), GTO (Gallium tin oxide) and FTO (fluorine doped tin oxide).

A pixel defining layer PDL may be disposed on the first electrode AE. The pixel defining layer PDL may be disposed between the pixel areas PXA and expose the first electrode AE. Furthermore, the pixel defining layer PDL may overlap an edge of the first electrode AE. Therefore, the pixel defining layer PDL may expose most of the area of the surface of the first electrode AE that faces the second substrate 120.

The pixel defining layer PDL may include organic insulating material. For example, the pixel defining layer PDL may include at least one selected from polystyrene, PMMA (polymethylmethacrylate), PAN (polyacrylonitrile), PA (polyamide), PI (polyimide), PAE (polyarylether), heterocyclic polymer, parylene, epoxy, BCB (benzocyclobutene), siloxane based resin, and silane based resin.

The light-emitting layer EML may be disposed on the exposed surface of the first electrode AE. The light-emitting layer EML may have a multilayer thin-film structure including at least a light generation layer (LGL). For instance, the light-emitting layer EML may include: a hole injection layer (HIL) into which holes are injected; a hole transport layer (HTL) which has excellent hole transportation performance and restrains movement of electrons that have not been coupled with holes in the light generation layer and thus increases chances of recombination between holes and electrons; the light generation layer which emits light by recombination between injected electrons and holes; a hole blocking layer (HBL) which restrains movement of holes that have not been coupled with electrons in the light generation layer; an electron transport layer (ETL) which is provided to smoothly transport electrons to the light generation layer; and an electron injection layer (EIL) into which electrons are injected.

The color of light generated from the light generation layer may be at least one selected from red, green, blue and white, but in the present embodiment, this is not limited. For example, the color of light generated from the light generation layer of the light-emitting layer EML may be at least one selected from magenta, cyan and yellow.

The hole injection layer, the hole transport layer, the hole blocking layer, the electron transport layer, and the electron injection layer may be common layers coupled between adjacent pixel areas.

The second electrode CE may be disposed on the light-emitting layer EML. The second electrode CE may be a semi-transmitting reflective layer. For example, the second electrode CE may be a thin metal layer having a thickness that allows light to pass therethrough. The second electrode CE may allow some of the light generated from the light generation layer to pass therethrough and may reflect the rest of the light generated from the light generation layer.

The second electrode CE may include material having a work function lower than that of the transparent conductive layer. For instance, the second electrode CE may include at least one selected from molybdenum (Mo), tungsten (W), silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), and an alloy of them.

Some of the light emitted from the light-emitting layer EML may not transmit through the second electrode CE, and light reflected by the second electrode CE is reflected by the reflective layer again. For example, light emitted from the light-emitting layer EML may resonate between the reflective layer and the second electrode CE. The light extraction efficiency of the display element DD may be enhanced by the resonance of light.

The distance between the reflective layer and the second electrode CE may change depending on the color of light generated from the light generation layer. For example, depending on the color of light generated from the light generation layer, the distance between the reflective layer and the second electrode CE may be adjusted to correspond to a resonance distance.

The encapsulating layer ECL may be provided on the second electrode CE. The encapsulating layer ECL may prevent oxygen or water from permeating the display element DD (or such permeation of oxygen and/or water may be reduced). The encapsulating layer ECL may include a plurality of inorganic layers and a plurality of organic layers. For example, the encapsulating layer ECL may include a plurality of encapsulating units, each of which includes an inorganic layer, and an organic layer disposed on the inorganic layer. The inorganic layer may include at least one selected from silicon oxide, silicon nitride, silicon oxynitride, aluminum oxide, titanium oxide, zirconium oxide, and tin oxide. The organic layer may include at least one selected from acryl, PI (polyimide), PA (polyamide) and BCB (benzocyclobutene).

A first connection pad area CPDA including first connection pads CPD, and a second connection pad area IMPA including second connection pads IMP may be provided in the non-display area NDA on the first base substrate SUB1. The first connection pad area CPDA and the second connection pad area IMPA may be disposed at positions spaced apart from each other. Furthermore, one selected from the first and second connection pad areas CPDA and IMPA, for example, the second connection pad area IMPA, may be disposed between the display area DA and the other one.

Each of the second connection pads IMP may include a first pattern IMP1, a second pattern IMP2, and a third pattern IMP3. The first pattern IMP1 and the third pattern IMP3 may be respectively provided on different surfaces of the first base substrate SUB1. The first pattern IMP1 may be provided on one surface of the first base substrate SUB1, for example, the surface of the first base substrate SUB1 on which the drive layer DDL is disposed. The second pattern IMP2 may be provided in a through hole that passes through the first base substrate SUB1, and may couple the first pattern IMP1 with the third pattern IMP3. The third pattern IMP3 may be provided on the other surface of the first base substrate SUB1, for example, the surface of the first base substrate SUB1 that is opposite to the surface thereof on which the drive layer DDL is disposed.

One selected from the first and second connection pads CPD and IMP may be electrically coupled with the other. For example, an area between the first connection pad area CPDA and the second connection pad area IMPA is bent, and each first connection pad CPD may directly contact the first pattern IMP1 of the corresponding second connection pad IMP.

In an embodiment of the present disclosure, portion of the non-sensing area NSA of the first substrate 110 may be bent. The first connection pads CPD and the second connection pads IMP may face each other by bending the first substrate 110.

The second substrate 120 may include a second base substrate SUB2, a touch sensor TS which is disposed on one surface of the second base substrate SUB2, for example, on the surface of the second base substrate SUB2 that faces the first substrate 110, and an insulating layer IL which is disposed between the second base substrate SUB2 and the touch sensor TS.

The second base substrate SUB2 may include transparent insulating material and allow light to pass therethrough. Furthermore, the second base substrate SUB2 may be formed of a rigid substrate or a flexible substrate. The rigid substrate may include a glass substrate, a quartz substrate, a glass ceramic substrate, and a crystalline glass substrate. The flexible substrate may include at least one selected from PES (polyethersulfone), polyacrylate, PEI (polyetherimide), PEN (polyethylene naphthalate), PET (polyethylene terephthalate), PPS (polyphenylene sulfide), PAR (polyarylate), PI (polyimide), PC (polycarbonate), TAC (triacetate cellulose), and CAP (cellulose acetate propionate). Furthermore, the flexible substrate may include FRP (fiber glass reinforced plastic).

The touch sensor TS may include a touch sensing electrode TSE which is disposed in the sensing area SA, a touch pad TPD which is disposed in the non-sensing area NSA, and a sensing line SL which couple the touch sensing electrode TSE with the touch pad TPD.

The touch pad TPD may be electrically coupled with the first connection pad CPD and the second connection pad IMP through the sensing line SL. Therefore, the touch pad TPD may apply a touch drive signal supplied from the outside, to the touch sensor TS through the first connection pad CPD and the second connection pad IMP, and transmit a touch sensing signal sensed by the touch sensor TS, to the outside.

Furthermore, the touch pad TPD may be disposed facing one selected from the first connection pad CPD and the second connection pad IMP, for example, the second connection pad IMP.

The insulating layer IL may include at least one selected from organic insulating material and inorganic insulating material. For example, the insulating layer IL may include at least one selected from silicon oxide and silicon nitride.

An adhesion layer ADL may be provided between the first substrate 110 and the second substrate 120. The adhesion layer ADL may include adhesive material allowing light to pass therethrough. For example, the adhesion layer ADL may include at least one selected from a photo-setting adhesive, a thermosetting adhesive, and a pressure sensitive adhesive (PSA).

Furthermore, a conductive member may be provided between the third pattern IMP3 of the second connection pad IMP and the touch pad TPD. The conductive member may electrically couple the third pattern IMP3 with the touch pad TPD. The conductive member may include a conductive ball (CMB) or a conductive adhesive layer. Hereinafter, there will be described the case where the conductive member includes the conductive ball CMB. The conductive ball CMB may be provided in the form in which conductive balls are distributed in an anisotropic conductive film or anisotropic conductive resin.

The distance between the third pattern IMP3 and the touch pad TPD when the first substrate 110 is in the bent state may be less than the distance between the third pattern IMP3 and the touch pad TPD when the first substrate 110 is not in the bent state. For example, the distance between the third pattern IMP3 and the touch pad TPD may be reduced by bending the first substrate 110.

When the distance between the third pattern IMP3 and the touch pad TPD is reduced, the size of the conductive ball CMB may also be reduced. In the case where the size of the conductive ball CMB is relatively small, even if a plurality of conductive balls CMB are present, a size deviation of the conductive balls CMB may be reduced. Therefore, contact failure between the third pattern IMP3 and the touch pad TPD may be prevented from being caused by a size deviation of the conductive balls CMB (or a likelihood or degree of such contact failure may be reduced).

Furthermore, as the size of the conductive ball CMB is reduced, failure which may be caused by unevenness in distance between the first substrate 110 and the second substrate 120 may be reduced. For instance, the distance between the first substrate 110 and the second substrate 120 in the area in which the conductive ball CMB is disposed, and the distance between the first substrate 110 and the second substrate 120 in the area in which the conductive ball CMB is not disposed, may become uniform (or substantially uniform).

Hereinafter, a method of manufacturing the display device will be described with reference to FIGS. 8-13.

FIGS. 8-13 are sectional views illustrating a manufacturing process in a method of manufacturing the display device shown in FIGS. 1-7.

Figure 8:
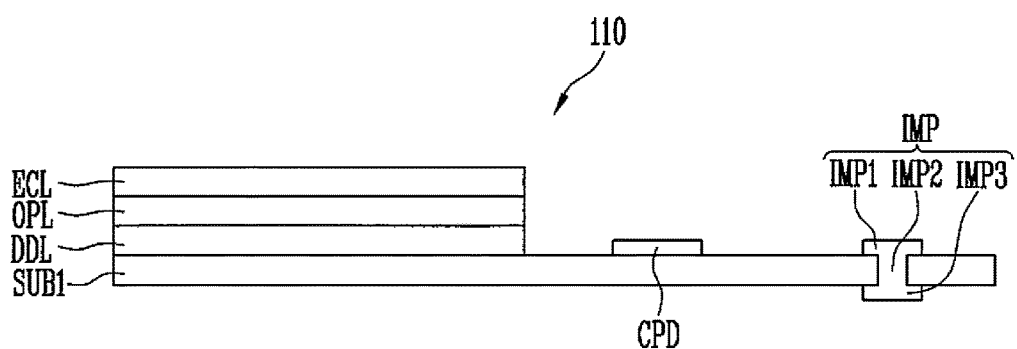
FIGS. 8-13 are sectional views illustrating a manufacturing process in a method of manufacturing the display device shown in FIGS. 1-7.

Referring to FIG. 8, the first substrate 110 is prepared. The first substrate 110 may include a first base substrate SUB1, a drive layer DDL which is provided on the first base substrate SUB1, an optical layer OPL which is provided on the drive layer DDL, and an encapsulating layer ECL which is provided on the optical layer OPL.

An embodiment of a method of manufacturing the first substrate 110 will be described in more detail.

The drive layer DDL is formed on the first base substrate SUB1.

The first base substrate SUB1 may include a display area (refer to "DA" of FIG. 2) and a non-display area (refer to "NDA" of FIG. 2).

The first base substrate SUB1 may include transparent insulating material and allow light to pass therethrough. Furthermore, the first base substrate SUB1 may be formed of a rigid substrate or a flexible substrate.

The drive layer DDL may include at least one thin film transistor (refer to "TFT" of FIG. 7), and a protective layer (refer to "PSL" of FIG. 7) which covers the thin film transistor. The thin film transistor TFT may include a semiconductor layer (refer to "SCL" of FIG. 7), a gate electrode (refer to "GE" of FIG. 7), a source electrode (refer to "SE" of FIG. 7), and a drain electrode (refer to "DE" of FIG. 7).

The drive layer DDL may be manufactured through the following process.

First, a buffer layer (refer to "BUL" of FIG. 7) is formed on the first base substrate SUB1. The buffer layer BUL may include inorganic insulating material.

After the buffer layer BUL has been formed, the semiconductor layer SCL is formed on the buffer layer BUL. Areas on the semiconductor layer SCL that are coupled to the source electrode SE and the drain electrode DE may be a source area and a drain area with or into which impurities have been doped or injected. An area between the source area and the drain area may be a channel area.

The semiconductor layer SCL may be formed by forming semiconductor material on the buffer layer BUL and then patterning it. The semiconductor material may include any one selected from amorphous silicon (Si), poly crystalline silicon (Si), an oxide semiconductor, and an organic semiconductor.

After the semiconductor layer SCL has been formed, a gate insulating layer GI may be formed to cover the semiconductor layer SCL. The gate insulating layer GI may cover the semiconductor layer SCL and the first base substrate SUB1. The gate insulating layer GI may insulate the semiconductor layer SCL from the gate electrode GE. The gate insulating layer GI may include at least one selected from organic insulating material and inorganic insulating material.

After the gate insulating layer GI has been formed, the gate electrode GE is formed on the gate insulating layer GI. The gate electrode GE may at least partially overlap the semiconductor layer SCL. The gate electrode GE may be formed by depositing low-resistance conductive material on the gate insulating layer GI and patterning it. The low-resistance conductive material may be made of any one selected from gold (Au), silver (Ag), aluminum (Al), molybdenum (Mo), chrome (Cr), titanium (Ti), nickel (Ni), neodymium (Nd), copper (Cu), tungsten (W), and an alloy of them. Furthermore, the gate electrode GE may include a plurality of conductive layers which are successively stacked.

After the gate electrode GE has been formed, the interlayer insulating layer ILD is formed to cover the gate electrode GE. The interlayer insulating layer ILD may include at least one selected from organic insulating material and inorganic insulating material. For example, the interlayer insulating layer ILD may include at least one selected from silicon oxide and silicon nitride. The interlayer insulating layer ILD may insulate the source electrode SE, the drain electrode DE and the gate electrode GE from each other.

After the interlayer insulating layer ILD has been formed, the interlayer insulating layer ILD is patterned such that the source area and the drain area of the semiconductor layer SCL are exposed.

After the interlayer insulating layer ILD has been patterned, the source electrode SE and the drain electrode DE are formed on the interlayer insulating layer ILD. Each of the source electrode SE and the drain electrode DE may be formed by depositing low-resistance conductive material and patterning it. The low-resistance conductive material may be made of any one selected from gold (Au), silver (Ag), aluminum (Al), molybdenum (Mo), chrome (Cr), titanium (Ti), nickel (Ni), neodymium (Nd), copper (Cu), tungsten (W), and an alloy of them. Furthermore, each of the source electrode SE and the drain electrode DE may include a plurality of conductive layers which are successively stacked.

In the present embodiment, there has been illustrated the case where the thin film transistor TFT is a thin film transistor having a top gate structure, but the present disclosure is not limited to this. For example, the thin film transistor TFT may be a thin film transistor having a bottom gate structure. If the thin film transistor TFT is a thin film transistor having a bottom gate structure, the gate electrode GE may be formed before the semiconductor layer SCL is formed, and the source electrode SE and the drain electrode DE may be formed after the semiconductor layer SCL is formed.

After the thin film transistor TFT has been formed, the protective layer PSL is formed to cover the thin film transistor TFT. The protective layer PSL may include at least one layer. For example, the protective layer PSL may include an inorganic protective layer, and an organic protective layer disposed on the inorganic protective layer. The inorganic protective layer may include at least one selected from silicon oxide and silicon nitride. The organic protective layer may include at least one selected from acryl, PI (polyimide), PA (polyamide) and BCB (benzocyclobutene). Furthermore, the organic protective layer may be a planarization layer that is transparent and flexible and thus makes it possible to mitigate unevenness of a lower structure and planarize the lower structure.

While the drive layer DDL is formed, the first connection pad area CPDA including the first connection pads CPD and the second connection pad area IMPA including the second connection pads IMP may be provided in the non-display area NDA on the first base substrate SUB1.

The first connection pad area CPDA and the second connection pad area IMPA may be disposed at positions spaced apart from each other. Furthermore, one selected from the first and second connection pad areas CPDA and IMPA, for example, the second connection pad area IMPA, may be disposed between the display area DA and the other one.

The first connection pads CPD and the second connection pads IMP may include the same (or substantially the same) material as that of the gate electrode GE and be manufactured through the same (or substantially the same) process as that of the gate electrode GE. In some embodiments, the first connection pads CPD and the second connection pads IMP may include the same (or substantially the same) material as that of the source electrode SE and be manufactured through the same (or substantially the same) process as that of the source electrode SE.

Each of the second connection pads IMP may include a first pattern IMP1, a second pattern IMP2, and a third pattern IMP3. The first pattern IMP1 and the third pattern IMP3 may be respectively provided on different surfaces of the first base substrate SUB1. The first pattern IMP1 may be provided on one surface of the first base substrate SUB1, for example, on the surface of the first base substrate SUB1 on which the drive layer DDL is disposed. The second pattern IMP2 may be provided in a through hole that passes through the first base substrate SUB1, and may couple the first pattern IMP1 with the third pattern IMP3. The third pattern IMP3 may be provided on the other surface of the first base substrate SUB1, for example, on the surface of the first base substrate SUB1 that is opposite to the surface thereof on which the drive layer DDL is disposed.

One selected from the first and second connection pads CPD and IMP may be electrically coupled with the other.

After the drive layer DDL has been formed, the protective layer PSL is patterned such that the drain electrode DE of the thin film transistor is exposed.

After the protective layer PSL has been patterned, the optical layer OPL is formed on the protective layer PSL. The optical layer OPL may include a display element DD which is electrically coupled with the drain electrode DE. The display element DD may include a first electrode AE which is coupled to the drain electrode DE, a light-emitting layer EML which is disposed on the first electrode AE, and a second electrode CE which is disposed on the light-emitting layer EML.

The optical layer OPL may be formed through the following process.

The first electrode AE is formed on the protective layer PSL. The first electrode AE may include a reflective layer which reflects light, and a transparent conductive layer which is disposed on or under the reflective layer. At least one selected from the transparent conductive layer and the reflective layer may be coupled with the drain electrode DE.

After the first electrode AE has been formed, a pixel defining layer PDL is formed such that the first electrode AE is exposed. The pixel defining layer PDL may be formed by applying organic insulating material on the first electrode AE and the protective layer PSL and patterning it. The organic insulating material may include at least one selected from polystyrene, PMMA (polymethylmethacrylate), PAN (polyacrylonitrile), PA (polyamide), PI (polyimide), PAE (polyarylether), heterocyclic polymer, parylene, epoxy, BCB (benzocyclobutene), siloxane based resin, and silane based resin.

The pixel defining layer PDL may be disposed between the pixel areas PXA and expose the first electrode AE. Furthermore, the pixel defining layer PDL may overlap the edge of the first electrode AE. Therefore, the pixel defining layer PDL may expose most of the area of the surface of the first electrode AE that faces the second substrate 120.

After the pixel defining layer PDL has formed, the light-emitting layer EML is formed on the first electrode AE. The light-emitting layer EML may have a multilayer thin-film structure including at least a light generation layer (LGL). For instance, the light-emitting layer EML may include: a hole injection layer (HIL) into which holes are injected; a hole transport layer (HTL) which has excellent hole transportation performance and restrains movement of electrons that have not been coupled with holes in the light generation layer and thus increases chances of recombination between holes and electrons; the light generation layer which emits light by recombination between injected electrons and holes; a hole blocking layer (HBL) which restrains movement of holes that have not been coupled with electrons in the light generation layer; an electron transport layer (ETL) which is provided to smoothly transport electrons to the light generation layer; and an electron injection layer (EIL) into which electrons are injected.

The color of light generated from the light generation layer may be at least one selected from red, green, blue and white, but in the present embodiment, this is not limited. For example, the color of light generated from the light generation layer of the light-emitting layer EML may be at least one selected from magenta, cyan and yellow.

The hole injection layer, the hole transport layer, the hole blocking layer, the electron transport layer, and the electron injection layer may be common layers coupled between adjacent pixel areas.

After the light-emitting layer EML has been formed, the second electrode CE is formed on the light-emitting layer EML. The second electrode CE may be a thin metal layer having a thickness that allows light to pass therethrough. The second electrode CE may allow some of the light generated from the light generation layer to pass therethrough and may reflect the rest of the light generated from the light generation layer. The second electrode CE may include material having a work function lower than that of the transparent conductive layer.

After the second electrode CE has been formed, the encapsulating layer ECL is formed on the optical layer OPL. The encapsulating layer ECL may be provided on the second electrode CE. The encapsulating layer ECL may prevent oxygen or water from permeating the display element DD (or such permeation of oxygen and/or water may be reduced). The encapsulating layer ECL may include a plurality of inorganic layers and a plurality of organic layers.

After the first substrate 110 has been prepared, the second substrate (refer to "120" of FIG. 6) is prepared. The second substrate 120 may include a second base substrate (refer to "SUB2" of FIG. 6), a touch sensor (refer to "TS" of FIG. 6) which is disposed on one surface of the second base substrate SUB2, for example, on the surface of the second base substrate SUB2 that faces the first substrate 110, and an insulating layer (refer to "IL" of FIG. 6) which is disposed between the second base substrate SUB2 and the touch sensor TS.

Hereinafter, a method of manufacturing the second substrate 120 will be described with reference to FIGS. 9-10.

Figure 9:
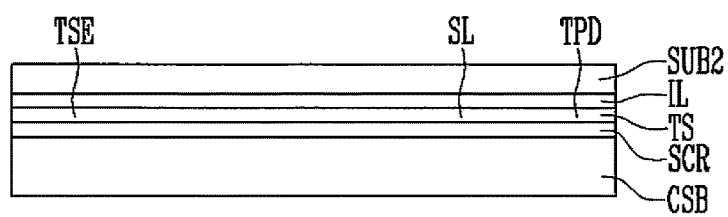

Referring to FIG. 9, a sacrificial layer SCR is formed on a carrier substrate CSB.

The carrier substrate CSB may be a kind of support substrate to be used to manufacture the second substrate 120. The carrier substrate CSB may be a rigid substrate and be formed of at least one selected from a glass substrate, a quartz substrate, a glass ceramic substrate, and a crystalline glass substrate.

The sacrificial layer SCR may be a layer to be used to separate the manufactured second substrate 120 from the carrier substrate CSB. The sacrificial layer SCR may include material having a selective etching ratio to the second substrate 120 with regard to etchant. Furthermore, the sacrificial layer SCR may include material that is reduced in adhesive force by heat or a laser beam.

After the sacrificial layer SCR has been formed, the second substrate 120 is formed on the sacrificial layer SCR.

In more detail, after the sacrificial layer SCR has been formed, the touch sensor TS is formed on the sacrificial layer SCR. The touch sensor TS may include a touch sensing electrode TSE which is disposed in the sensing area (refer to "SA" of FIG. 3), a touch pad TPD which is disposed in the non-sensing area (refer to "NSA" of FIG. 3), and a sensing line SL which couple the touch sensing electrode TSE with the touch pad TPD.

After the touch sensor TS has been formed, the insulating layer IL is formed on the touch sensor TS. The insulating layer IL may include at least one selected from organic insulating material and inorganic insulating material. For example, the insulating layer IL may include at least one selected from silicon oxide and silicon nitride.

After the insulating layer IL has been formed, the second base substrate SUB2 is formed on the insulating layer IL. The second base substrate SUB2 may be a transparent flexible substrate. For example, the second base substrate SUB2 may include at least one selected from PES (polyethersulfone), polyacrylate, PEI (polyetherimide), PEN (polyethylene naphthalate), PET (polyethylene terephthalate), PPS (polyphenylene sulfide), PAR (polyarylate), PI (polyimide), PC (polycarbonate), TAC (triacetate cellulose), and CAP (cellulose acetate propionate).

In the present embodiment, the insulating layer IL, the touch sensor TS and the second base substrate SUB2 have been illustrated as being successively formed on the sacrificial layer SCR after the sacrificial layer SCR is formed. However, the present disclosure is not limited to this. For example, after the sacrificial layer SCR has been formed, the second base substrate SUB2, the touch sensor TS and the insulating layer IL may be successively formed on the sacrificial layer SCR.

Figure 10:
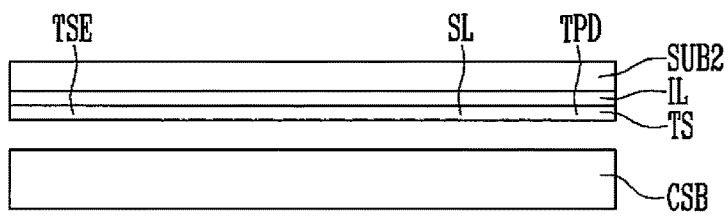

Referring to FIG. 10, after the second substrate 120 has been formed on the sacrificial layer SCR, the carrier substrate CSB and the second substrate 120 are separated from each other. In this regard, a method of separating the second substrate 120 from the carrier substrate CSB may be changed depending on characteristics of the sacrificial layer SCR.

For instance, in the case where the sacrificial layer SCR includes material having a selective etching ratio to the second substrate 120 with regard to etchant, the second substrate 120 may be separated from the carrier substrate CSB by removing the sacrificial layer SCR using the etchant.

In some embodiments, in the case where the sacrificial layer SCR includes material that is reduced in adhesive force by heat or a laser beam, the second substrate 120 may be physically separated from the carrier substrate CSB by applying heat or a laser beam to the sacrificial layer SCR and thus reducing the adhesive force of the sacrificial layer SCR.

Figure 11:
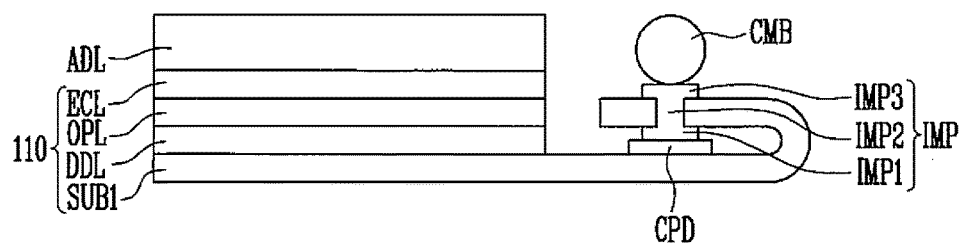

Referring to FIG. 11, after the second substrate 120 has been separated from the carrier substrate CSB, a portion of the non-display area NDA of the first substrate 110 is bent. One selected from the first and second connection pads CPD and IMP may be electrically coupled with the other by bending the first substrate 110. For example, the area between the first connection pad area CPDA and the second connection pad area IMPA is bent, and the first connection pad CPD may directly contact the first pattern IMP1. Furthermore, the third pattern IMP3 may face the touch pad TPD by bending the first substrate 110.

After the first substrate 110 has been bent, the adhesion layer ADL is formed on the first substrate 110. The adhesion layer ADL may be provided neither on the first connection pad area CPDA nor on the second connection pad area IMPA (e.g., the CPDA and IMPA may be substantially free or completely free of the ADL). The adhesion layer ADL may include adhesive material allowing light to pass therethrough. For example, the adhesion layer ADL may include at least one selected from a photo-setting adhesive, a thermosetting adhesive, and a pressure sensitive adhesive (PSA).

Thereafter, the conductive ball CMB is disposed on the third pattern IMP3. The conductive ball CMB may be provided in the form in which conductive balls are distributed in an anisotropic conductive film or anisotropic conductive resin.

In the present embodiment, the conductive ball CMB has been illustrated as being disposed after the adhesion layer ADL is formed, but the present disclosure is not limited to this. For example, after the conductive ball CMB is disposed, the adhesion layer ADL may be formed.

Figure 12:
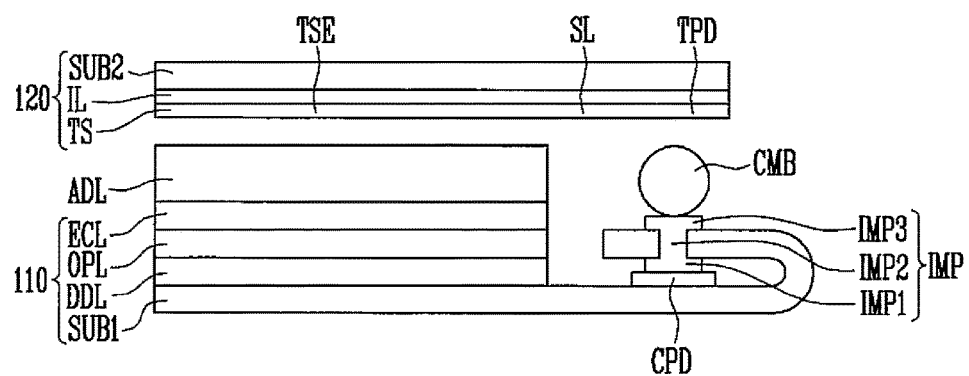

Referring to FIG. 12, after the conductive ball CMB has been disposed on the third pattern IMP3, the second substrate 120 is disposed on the first substrate 110.

Figure 13:
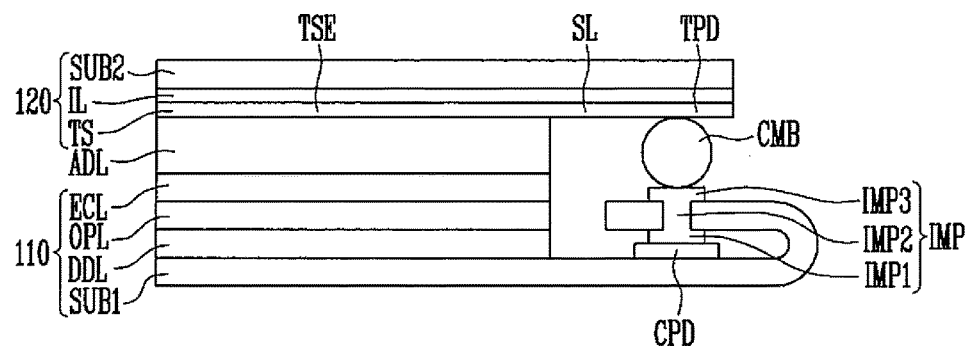

Referring to FIG. 13, after the second substrate 120 has been disposed on the first substrate 110, the first substrate 110 and the second substrate 120 are adhered to each other by applying heat or pressure to the first substrate 110 and the second substrate 120 or emitting light thereto.

In this regard, the first substrate 110 and the second substrate 120 may be adhered to each other by the adhesion layer ADL. The third pattern IMP3 and the touch pad TPD may be electrically coupled with each other by the conductive ball CMB.

The distance between the third pattern IMP3 and the touch pad TPD when the first substrate 110 is in the bent state may be less than the distance between the third pattern IMP3 and the touch pad TPD when the first substrate 110 is not in the bent state. For example, the distance between the third pattern IMP3 and the touch pad TPD may be reduced by bending the first substrate 110.

If the distance between the third pattern IMP3 and the touch pad TPD is reduced, the size of the conductive ball CMB may also be reduced. In the case where the size of the conductive ball CMB is relatively small, even if a plurality of conductive balls CMB are present, a size deviation of the conductive balls CMB may be reduced. Therefore, contact failure between the touch pad TPD and the third pattern IMP3 may be prevented from being caused by a size deviation of the conductive balls CMB (or a likelihood or degree of such contact failure may be reduced).

Furthermore, as the size of the conductive ball CMB is reduced, failure which may be caused by unevenness in distance between the first substrate 110 and the second substrate 120 may be reduced. For instance, the distance between the first substrate 110 and the second substrate 120 in the area in which the conductive ball CMB is disposed, and the distance between the first substrate 110 and the second substrate 120 in the area in which the conductive ball CMB is not disposed, may become uniform (or substantially uniform).

Figure 14:
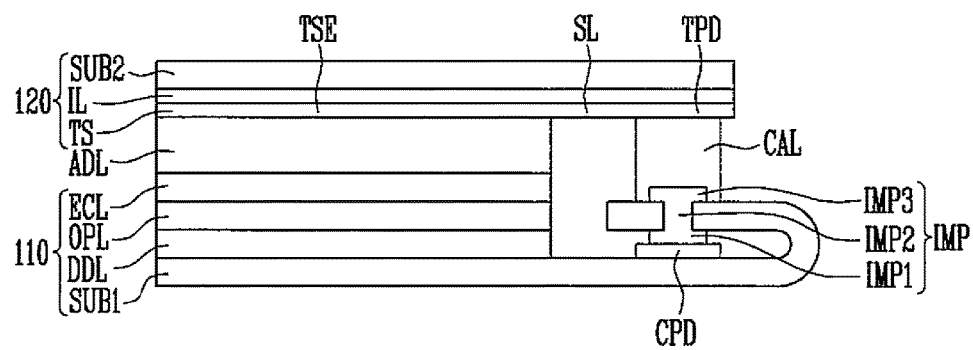
FIGS. 14-18 are sectional views illustrating a display device in accordance with another embodiment of the present disclosure.

FIG. 14 is a sectional view illustrating a display device in accordance with another embodiment of the present disclosure.

Referring to FIGS. 1-5 and 14, the display device may include a first substrate 110, a second substrate 120 that faces the first substrate 110, and an adhesion layer ADL that adheres the first substrate 110 and the second substrate 120 to each other.

The first substrate 110 may include a first base substrate SUB1, a drive layer DDL which is provided on the first base substrate SUB1, an optical layer OPL which is provided on the drive layer DDL, and an encapsulating layer ECL which is provided on the optical layer OPL.

The first base substrate SUB1 may include a display area DA and a non-display area NDA. The display area DA may be provided with a plurality of pixel areas PXA. The non-display area NDA may be disposed adjacent to the display area DA.

The first base substrate SUB1 may include transparent insulating material and allow light to pass therethrough. Furthermore, the first base substrate SUB1 may be formed of a rigid substrate or a flexible substrate.

The drive layer DDL may be provided on the first base substrate SUB1, and include at least one thin film transistor provided in each pixel area PXA, and a protective layer which covers the thin film transistor.

The optical layer OPL may be provided on the drive layer DDL, and include a display element which is coupled to the thin film transistor.

The encapsulating layer ECL may be provided on the optical layer OPL. For example, the encapsulating layer ECL may cover the optical layer OPL. The encapsulating layer ECL may prevent oxygen or water from permeating the display element DD (or such permeation of oxygen and/or water may be reduced). The encapsulating layer ECL may include a plurality of inorganic layers and a plurality of organic layers.

A first connection pad area CPDA including a first connection pad CPD and a second connection pad area IMPA including a second connection pad IMP may be provided in the non-display area NDA on the first base substrate SUB1. The first connection pad area CPDA and the second connection pad area IMPA may be disposed at positions spaced apart from each other. The second connection pad area IMPA may be disposed between the display area DA and the first connection pad area CPDA.

The second connection pad IMP may include a first pattern IMP1, a second pattern IMP2, and a third pattern IMP3. The first pattern IMP1 may be provided on the surface of the first base substrate SUB1 on which the drive layer DDL is disposed, and may have a shape in which it extends from the first connection pad CPD. The second pattern IMP2 may be provided in a through hole that passes through the first base substrate SUB1, and may couple the first pattern IMP1 with the third pattern IMP3. The third pattern IMP3 may be provided on the surface of the first base substrate SUB1 that is opposite to the surface thereof on which the drive layer DDL is disposed.

In an embodiment of the present disclosure, portion of the non-sensing area NSA of the first substrate 110 may be bent. Due to the bent structure of the first substrate 110, the first connection pad CPD may be disposed facing the first pattern IMP1, and the first connection pad CPD and the first pattern IMP1 may directly contact each other.

The second substrate 120 may include a second base substrate SUB2, a touch sensor TS which is disposed on one surface of the second base substrate SUB2, for example, on the surface of the second base substrate SUB2 that faces the first substrate 110, and an insulating layer IL which is disposed between the second base substrate SUB2 and the touch sensor TS.

The second base substrate SUB2 may include transparent insulating material and thus allow light to pass therethrough. Furthermore, the second base substrate SUB2 may be formed of a rigid substrate or a flexible substrate.

The touch sensor TS may include a touch sensing electrode TSE which is disposed in the sensing area SA, a touch pad TPD which is disposed in the non-sensing area NSA, and a sensing line SL which couple the touch sensing electrode TSE with the touch pad TPD.

In an embodiment of the present disclosure, the third pattern IMP3 may be disposed, facing the touch pad TPD, by bending the first substrate 110. A conductive member may be provided between the third pattern IMP3 and the touch pad TPD. In this regard, the conductive member may include a conductive ball or a conductive adhesive layer CAL. Hereinafter, there will be described the case where the conductive member includes the conductive adhesive layer CAL. The conductive adhesive layer CAL may electrically couple the third pattern IMP3 with the touch pad TPD. The conductive adhesive layer may include conductive paste. For example, the conductive adhesive layer CAL may include at least one selected from silver (Ag) paste, copper (Cu) paste, solder paste, and ITO paste.

The adhesion layer ADL may be between the first substrate 110 and the second substrate 120. The adhesion layer ADL may adhere the first substrate 110 and the second substrate 120 to each other.

Figure 15:
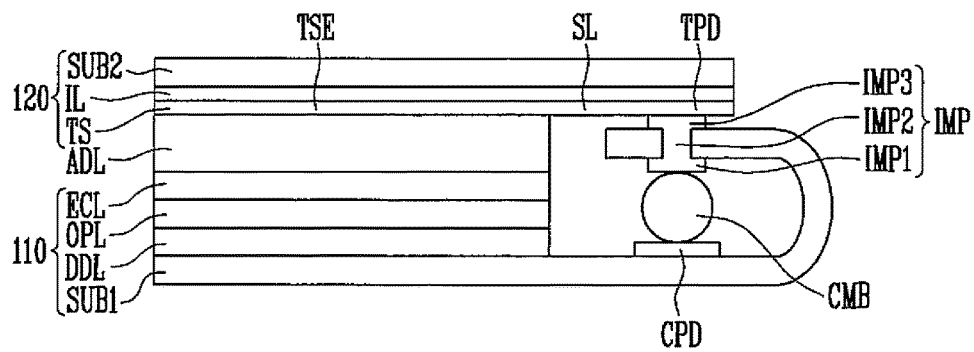

FIG. 15 is a sectional view illustrating a display device in accordance with yet embodiment of the present disclosure.

Referring to FIGS. 1-5 and 15, the display device may include a first substrate 110, a second substrate 120 that faces the first substrate 110, and an adhesion layer ADL that adheres the first substrate 110 and the second substrate 120 to each other.

The first substrate 110 may include a first base substrate SUB1, a drive layer DDL which is provided on the first base substrate SUB1, an optical layer OPL which is provided on the drive layer DDL, and an encapsulating layer ECL which is provided on the optical layer OPL.

The first base substrate SUB1 may include a display area DA and a non-display area NDA. The display area DA may be provided with a plurality of pixel areas PXA. The non-display area NDA may be disposed adjacent to the display area DA.

The first base substrate SUB1 may include transparent insulating material and allow light to pass therethrough. Furthermore, the first base substrate SUB1 may be formed of a rigid substrate or a flexible substrate.

The drive layer DDL may be provided on the first base substrate SUB1, and include at least one thin film transistor provided in each pixel area PXA, and a protective layer which covers the thin film transistor.

The optical layer OPL may be provided on the drive layer DDL, and include a display element which is coupled to the thin film transistor.

The encapsulating layer ECL may be provided on the optical layer OPL. For example, the encapsulating layer ECL may cover the optical layer OPL. The encapsulating layer ECL may prevent oxygen or water from permeating the display element DD (or such permeation of oxygen and/or water may be reduced). The encapsulating layer ECL may include a plurality of inorganic layers and a plurality of organic layers.

A first connection pad area CPDA including a first connection pad CPD and a second connection pad area IMPA including a second connection pad IMP may be provided in the non-display area NDA on the first base substrate SUB1. The first connection pad area CPDA and the second connection pad area IMPA may be disposed at positions spaced apart from each other. The second connection pad area IMPA may be disposed between the display area DA and the first connection pad area CPDA.

The second connection pad IMP may include a first pattern IMP1, a second pattern IMP2, and a third pattern IMP3. The first pattern IMP1 may be provided on the surface of the first base substrate SUB1 on which the drive layer DDL is disposed. The second pattern IMP2 may be provided in a through hole that passes through the first base substrate SUB1, and may couple the first pattern IMP1 with the third pattern IMP3. The third pattern IMP3 may be provided on the surface of the first base substrate SUB1 that is opposite to the surface thereof on which the drive layer DDL is disposed.

In an embodiment of the present disclosure, portion of the non-sensing area NSA of the first substrate 110 may be bent. The first connection pad CPD may face the first pattern IMP1 by bending the first substrate 110. A conductive ball CMB may be provided between the first connection pad CPD and the first pattern IMP1. The conductive ball CMB may electrically couple the first connection pad CPD with the first pattern IMP1. In the present embodiment, there has been illustrated the case where the first connection pad CPD and the first pattern IMP1 are electrically coupled to each other by the conductive ball CMB, but the present disclosure is not limited to this. For example, the first connection pad CPD and the first pattern IMP1 may be electrically coupled to each other by a conductive adhesive layer.

The second substrate 120 may include a second base substrate SUB2, a touch sensor TS which is disposed on one surface of the second base substrate SUB2, for example, on the surface of the second base substrate SUB2 that faces the first substrate 110, and an insulating layer IL which is disposed between the second base substrate SUB2 and the touch sensor TS.

The second base substrate SUB2 may include transparent insulating material and thus allow light to pass therethrough. Furthermore, the second base substrate SUB2 may be formed of a rigid substrate or a flexible substrate.

The touch sensor TS may include a touch sensing electrode TSE which is disposed in the sensing area SA, a touch pad TPD which is disposed in the non-sensing area NSA, and a sensing line SL which couple the touch sensing electrode TSE with the touch pad TPD.

In an embodiment of the present disclosure, due to the bent structure of the first substrate 110, the third pattern IMP3 may be disposed facing the touch pad TPD and be brought into direct contact with the touch pad TPD. Because the third pattern IMP3 and the touch pad TPD directly contact each other, no conductive ball may be required. Therefore, contact failure between the third pattern IMP3 and the touch pad TPD may be prevented from being caused by a size deviation of conductive balls CMB (or a likelihood or degree of such contact failure may be reduced).

In addition, an adhesion layer ADL may be between the first substrate 110 and the second substrate 120. The adhesion layer ADL may adhere the first substrate 110 and the second substrate 120 to each other.

Figure 16:
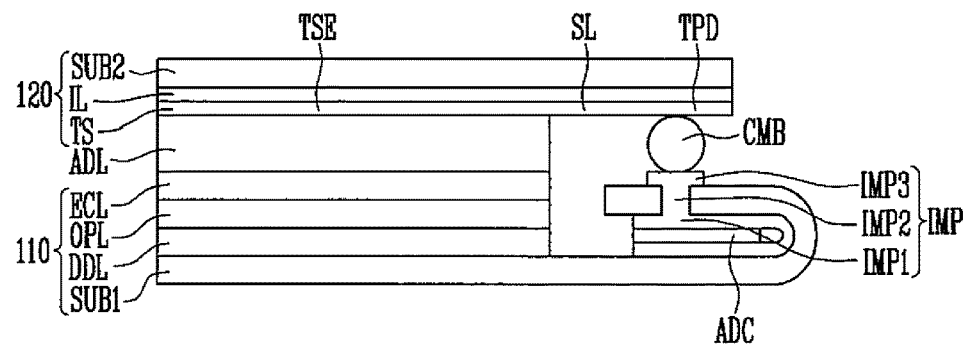

FIG. 16 is a sectional view illustrating a display device in accordance with still yet another embodiment of the present disclosure.

Referring to FIGS. 1-5 and 16, the display device may include a first substrate 110, a second substrate 120 that faces the first substrate 110, and an adhesion layer ADL that adheres the first substrate 110 and the second substrate 120 to each other.

The first substrate 110 may include a first base substrate SUB1, a drive layer DDL which is provided on the first base substrate SUB1, an optical layer OPL which is provided on the drive layer DDL, and an encapsulating layer ECL which is provided on the optical layer OPL.

The first base substrate SUB1 may include a display area DA and a non-display area NDA. The display area DA may be provided with a plurality of pixel areas PXA. The non-display area NDA may be disposed adjacent to the display area DA.

The first base substrate SUB1 may include transparent insulating material and allow light to pass therethrough. Furthermore, the first base substrate SUB1 may be formed of a rigid substrate or a flexible substrate.

The drive layer DDL may be provided on the first base substrate SUB1, and include at least one thin film transistor provided in each pixel area PXA, and a protective layer which covers the thin film transistor.

The optical layer OPL may be provided on the drive layer DDL, and include a display element which is coupled to the thin film transistor.

The encapsulating layer ECL may be provided on the optical layer OPL. For example, the encapsulating layer ECL may cover the optical layer OPL. The encapsulating layer ECL may prevent oxygen or water from permeating the display element DD (or such permeation of oxygen and/or water may be reduced). The encapsulating layer ECL may include a plurality of inorganic layers and a plurality of organic layers.

A first connection pad area CPDA including a first connection pad CPD and a second connection pad area IMPA including a second connection pad IMP may be provided in the non-display area NDA on the first base substrate SUB1. The first connection pad area CPDA and the second connection pad area IMPA may be disposed at positions spaced apart from each other. The second connection pad area IMPA may be disposed between the display area DA and the first connection pad area CPDA.

The second connection pad IMP may include a first pattern IMP1, a second pattern IMP2, and a third pattern IMP3. The first pattern IMP1 may be provided on the surface of the first base substrate SUB1 on which the drive layer DDL is disposed, and may have a shape in which it extends from the first connection pad CPD. The second pattern IMP2 may be provided in a through hole that passes through the first base substrate SUB1, and may couple the first pattern IMP1 with the third pattern IMP3. The third pattern IMP3 may be provided on the surface of the first base substrate SUB1 that is opposite to the surface thereof on which the drive layer DDL is disposed.

In an embodiment of the present disclosure, portion of the non-sensing area NSA of the first substrate 110 may be bent. The first connection pad CPD may face the first pattern IMP1 by bending the first substrate 110. An elastic member ADC may be disposed between the first connection pad CPD and the first pattern IMP1 that face each other. The elastic member ADC may include an elastic film which is formed such that, even when it is deformed by external pressure or impact, it can be restored to its original shape, and an adhesive applied to opposite surfaces of the elastic film. Therefore, the elastic member ADC may function as a support making it possible for the first substrate 110 to be maintained (e.g., at least substantially maintained) in the bent state.

The second substrate 120 may include a second base substrate SUB2, a touch sensor TS which is disposed on one surface of the second base substrate SUB2, for example, on the surface of the second base substrate SUB2 that faces the first substrate 110, and an insulating layer IL which is disposed between the second base substrate SUB2 and the touch sensor TS.

The second base substrate SUB2 may include transparent insulating material and thus allow light to pass therethrough. Furthermore, the second base substrate SUB2 may be formed of a rigid substrate or a flexible substrate.

The touch sensor TS may include a touch sensing electrode TSE which is disposed in the sensing area SA, a touch pad TPD which is disposed in the non-sensing area NSA, and a sensing line SL which couple the touch sensing electrode TSE with the touch pad TPD.

In an embodiment of the present disclosure, the third pattern IMP3 may be disposed, facing the touch pad TPD, by bending the first substrate 110. A conductive ball CMB may be disposed between the third pattern IMP3 and the touch pad TPD. The conductive ball CMB may electrically couple the third pattern IMP3 with the touch pad TPD. In the present embodiment, there has been illustrated the case where the touch pad TPD and the third pattern IMP3 are electrically coupled to each other by the conductive ball CMB, but the present disclosure is not limited to this. For example, the touch pad TPD and the third pattern IMP3 may be electrically coupled to each other by a conductive adhesive layer.

Figure 17:
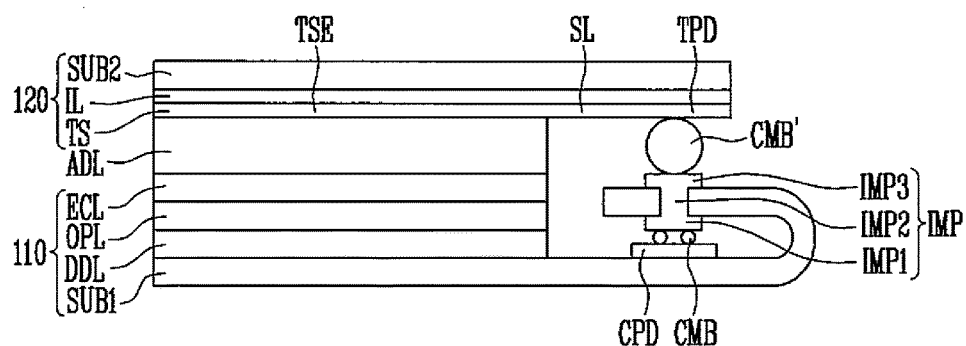

FIG. 17 is a sectional view illustrating a display device in accordance with still yet another embodiment of the present disclosure.

Referring to FIGS. 1-5 and 17, the display device may include a first substrate 110, a second substrate 120 that faces the first substrate 110, and an adhesion layer ADL that adheres the first substrate 110 and the second substrate 120 to each other.

The first substrate 110 may include a first base substrate SUB1, a drive layer DDL which is provided on the first base substrate SUB1, an optical layer OPL which is provided on the drive layer DDL, and an encapsulating layer ECL which is provided on the optical layer OPL.

The first base substrate SUB1 may include a display area DA and a non-display area NDA. The display area DA may be provided with a plurality of pixel areas PXA. The non-display area NDA may be disposed adjacent to the display area DA.

The first base substrate SUB1 may include transparent insulating material and allow light to pass therethrough. Furthermore, the first base substrate SUB1 may be formed of a rigid substrate or a flexible substrate.

The drive layer DDL may be provided on the first base substrate SUB1, and include at least one thin film transistor provided in each pixel area PXA, and a protective layer which covers the thin film transistor.

The optical layer OPL may be provided on the drive layer DDL, and include a display element which is coupled to the thin film transistor.

The encapsulating layer ECL may be provided on the optical layer OPL. For example, the encapsulating layer ECL may cover the optical layer OPL. The encapsulating layer ECL may prevent oxygen or water from permeating the display element DD (or such permeation of oxygen and/or water may be reduced). The encapsulating layer ECL may include a plurality of inorganic layers and a plurality of organic layers.

A first connection pad area CPDA including a first connection pad CPD and a second connection pad area IMPA including a second connection pad IMP may be provided in the non-display area NDA on the first base substrate SUB1. The first connection pad area CPDA and the second connection pad area IMPA may be disposed at positions spaced apart from each other. The second connection pad area IMPA may be disposed between the display area DA and the first connection pad area CPDA.

The second connection pad IMP may include a first pattern IMP1, a second pattern IMP2, and a third pattern IMP3. The first pattern IMP1 may be provided on the surface of the first base substrate SUB1 on which the drive layer DDL is disposed, and may have a shape in which it extends from the first connection pad CPD. The second pattern IMP2 may be provided in a through hole that passes through the first base substrate SUB1, and may couple the first pattern IMP1 with the third pattern IMP3. The third pattern IMP3 may be provided on the surface of the first base substrate SUB1 that is opposite to the surface thereof on which the drive layer DDL is disposed.

In an embodiment of the present disclosure, portion of the non-sensing area NSA of the first substrate 110 may be bent. The first connection pad CPD may face the first pattern IMP1 by bending the first substrate 110. At least one first conductive ball CMB may be provided between the first connection pad CPD and the first pattern IMP1. The first conductive ball CMB may electrically couple the first connection pad CPD with the first pattern IMP1. In the present embodiment, there has been illustrated the case where the first connection pad CPD and the first pattern IMP1 are electrically coupled to each other by the first conductive ball CMB, but the present disclosure is not limited to this. For example, the first connection pad CPD and the first pattern IMP1 may be electrically coupled to each other by a conductive adhesive layer.

The second substrate 120 may include a second base substrate SUB2, a touch sensor TS which is disposed on one surface of the second base substrate SUB2, for example, on the surface of the second base substrate SUB2 that faces the first substrate 110, and an insulating layer IL which is disposed between the second base substrate SUB2 and the touch sensor TS.

The second base substrate SUB2 may include transparent insulating material and thus allow light to pass therethrough. Furthermore, the second base substrate SUB2 may be formed of a rigid substrate or a flexible substrate.

The touch sensor TS may include a touch sensing electrode TSE which is disposed in the sensing area SA, a touch pad TPD which is disposed in the non-sensing area NSA, and a sensing line SL which couple the touch sensing electrode TSE with the touch pad TPD.

In an embodiment of the present disclosure, the third pattern IMP3 may be disposed, facing the touch pad TPD, by bending the first substrate 110. A second conductive ball CMB' may be disposed between the third pattern IMP3 and the touch pad TPD. The second conductive ball CMB' may electrically couple the third pattern IMP3 with the touch pad TPD. In an embodiment, the size of the second conductive ball CMB' may be equal to or greater than the size of the first conductive ball CMB. In the present embodiment, there has been illustrated the case where the touch pad TPD and the third pattern IMP3 are electrically coupled to each other by the second conductive ball CMB', but the present disclosure is not limited to this. For example, the touch pad TPD and the third pattern IMP3 may be electrically coupled to each other by a conductive adhesive layer.

Figure 18:
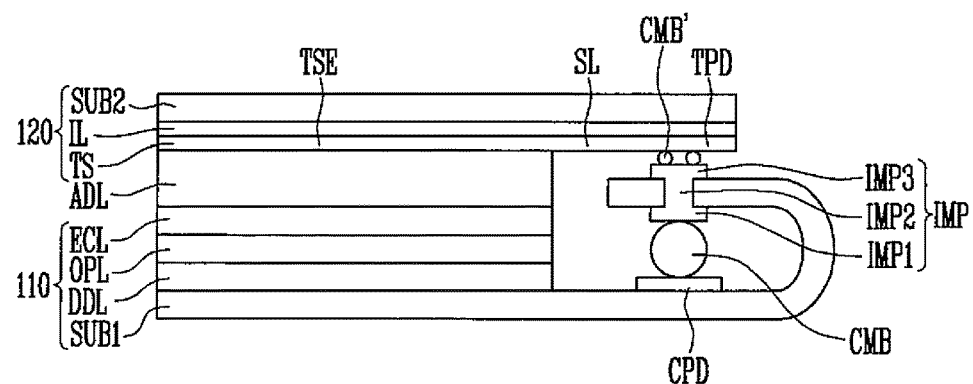

FIG. 18 is a sectional view illustrating a display device in accordance with still yet another embodiment of the present disclosure.

Referring to FIGS. 1-5 and 18, the display device may include a first substrate 110, a second substrate 120 that faces the first substrate 110, and an adhesion layer ADL that adheres the first substrate 110 and the second substrate 120 to each other.

The first substrate 110 may include a first base substrate SUB1, a drive layer DDL which is provided on the first base substrate SUB1, an optical layer OPL which is provided on the drive layer DDL, and an encapsulating layer ECL which is provided on the optical layer OPL.

The first base substrate SUB1 may include a display area DA and a non-display area NDA. The display area DA may be provided with a plurality of pixel areas PXA. The non-display area NDA may be disposed adjacent to the display area DA.

The first base substrate SUB1 may include transparent insulating material and allow light to pass therethrough. Furthermore, the first base substrate SUB1 may be formed of a rigid substrate or a flexible substrate.

The drive layer DDL may be provided on the first base substrate SUB1, and include at least one thin film transistor provided in each pixel area PXA, and a protective layer which covers the thin film transistor.

The optical layer OPL may be provided on the drive layer DDL, and include a display element which is coupled to the thin film transistor.

The encapsulating layer ECL may be provided on the optical layer OPL. For example, the encapsulating layer ECL may cover the optical layer OPL. The encapsulating layer ECL may prevent oxygen or water from permeating the display element DD (or such permeation of oxygen and/or water may be reduced). The encapsulating layer ECL may include a plurality of inorganic layers and a plurality of organic layers.

A first connection pad area CPDA including a first connection pad CPD and a second connection pad area IMPA including a second connection pad IMP may be provided in the non-display area NDA on the first base substrate SUB1. The first connection pad area CPDA and the second connection pad area IMPA may be disposed at positions spaced apart from each other. The second connection pad area IMPA may be disposed between the display area DA and the first connection pad area CPDA.

The second connection pad IMP may include a first pattern IMP1, a second pattern IMP2, and a third pattern IMP3. The first pattern IMP1 may be provided on the surface of the first base substrate SUB1 on which the drive layer DDL is disposed, and may have a shape in which it extends from the first connection pad CPD. The second pattern IMP2 may be provided in a through hole that passes through the first base substrate SUB1, and may couple the first pattern IMP1 with the third pattern IMP3. The third pattern IMP3 may be provided on the surface of the first base substrate SUB1 that is opposite to the surface thereof on which the drive layer DDL is disposed.

In an embodiment of the present disclosure, portion of the non-sensing area NSA of the first substrate 110 may be bent. The first connection pad CPD may face the first pattern IMP1 by bending the first substrate 110. A first conductive ball CMB may be provided between the first connection pad CPD and the first pattern IMP1. The first conductive ball CMB may electrically couple the first connection pad CPD with the first pattern IMP1. In the present embodiment, there has been illustrated the case where the first connection pad CPD and the first pattern IMP1 are electrically coupled to each other by the first conductive ball CMB, but the present disclosure is not limited to this. For example, the first connection pad CPD and the first pattern IMP1 may be electrically coupled to each other by a conductive adhesive layer.

The second substrate 120 may include a second base substrate SUB2, a touch sensor TS which is disposed on one surface of the second base substrate SUB2, for example, on the surface of the second base substrate SUB2 that faces the first substrate 110, and an insulating layer IL which is disposed between the second base substrate SUB2 and the touch sensor TS.

The second base substrate SUB2 may include transparent insulating material and thus allow light to pass therethrough. Furthermore, the second base substrate SUB2 may be formed of a rigid substrate or a flexible substrate.

The touch sensor TS may include a touch sensing electrode TSE which is disposed in the sensing area SA, a touch pad TPD which is disposed in the non-sensing area NSA, and a sensing line SL which couple the touch sensing electrode TSE with the touch pad TPD.

In an embodiment of the present disclosure, the third pattern IMP3 may be disposed, facing the touch pad TPD, by bending the first substrate 110. At least one second conductive ball CMB' may be disposed between the third pattern IMP3 and the touch pad TPD. The second conductive ball CMB' may electrically couple the third pattern IMP3 with the touch pad TPD. In this regard, the size of the second conductive ball CMB' may be equal to or less than the size of the first conductive ball CMB. In the present embodiment, there has been illustrated the case where the touch pad TPD and the third pattern IMP3 are electrically coupled to each other by the second conductive ball CMB', but the present disclosure is not limited to this. For example, the touch pad TPD and the third pattern IMP3 may be electrically coupled to each other by a conductive adhesive layer.

Figure 19:
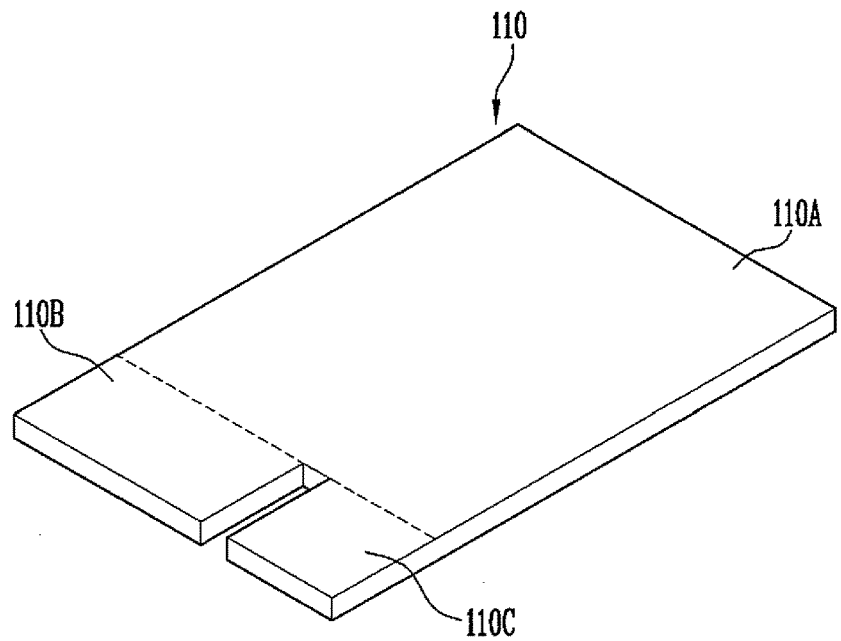
FIG. 19 is a perspective view illustrating the shape of a first substrate shown in FIGS. 1-18 that is not in a bent state.
Figure 20:
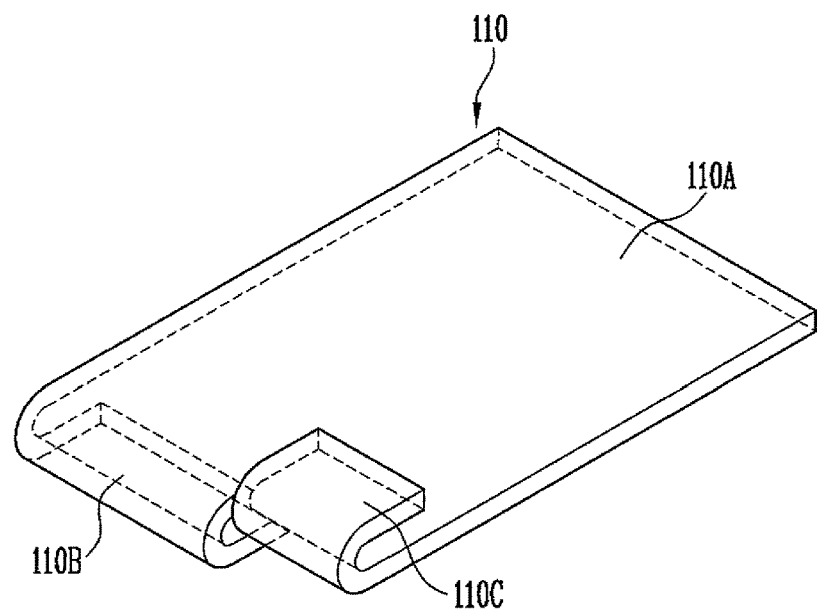
FIG. 20 is a perspective view illustrating a bent shape of the first substrate of FIG. 19.
Figure 21:
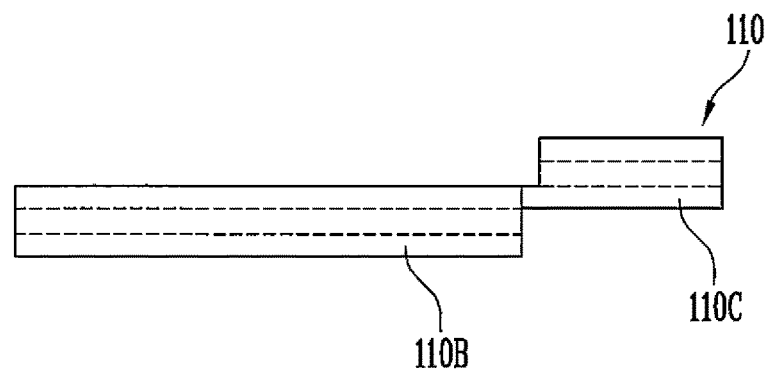
FIG. 21 is a side view of the first substrate shown in FIG. 20.

FIG. 19 is a perspective view illustrating the shape of the first substrate shown in FIGS. 1-18 that is not in a bent state. FIG. 20 is a perspective view illustrating a bent shape of the first substrate of FIG. 19. FIG. 21 is a side view of the first substrate shown in FIG. 20.

Referring to FIGS. 19-21, the first substrate 110 may include a flat area 110A, and at least one bent area 110B, 110C which borders the flat area 110A.

The display area (refer to "DA" of FIG. 2) and the first connection pad area (refer to "CPDA" of FIG. 2) may be provided on the flat area 110A.

The flat area 110A may have various suitable shapes such as a closed polygon including linear sides, a circle, an ellipse or the like including a side formed of a curved line, and a semicircle, a semi-ellipse or the like including sides formed of a linear line and a curved line, and so forth. In an embodiment of the present disclosure, for the sake of explanation, there will be described the case where the flat area 110A has a polygonal shape.

Spaced apart from each other, two bent areas 110B and 110C, for example, a first bent area 110B and a second bent area 110C, may be provided on one side of the flat area 110A in a shape in which the bent areas 110B and 110C extend and protrude from the flat area 110A. One selected from the first bent area 110B and the second bent area 110C, for example, the first bent area 110B, may be an area on which pads for supplying signals to the drive layer (refer to "DDL" of FIG. 6) and the optical layer (refer to "OPL" of FIG. 6) are disposed.

The other one selected from the first bent area 110B and the second bent area 110C, for example, the second bent area 110C, may be an area on which the second connection pad area (refer to "IMPA" of FIG. 2) is provided.

The first bent area 110B and the second bent area 110C may be bent in different directions. For example, the second bent area 110C may be bent toward the second substrate (refer to "120" of FIG. 1) that is disposed on the first substrate 110. The first bent area 110B may be bent in a direction opposite to the direction in which the second substrate 120 is bent.

Figure 22:
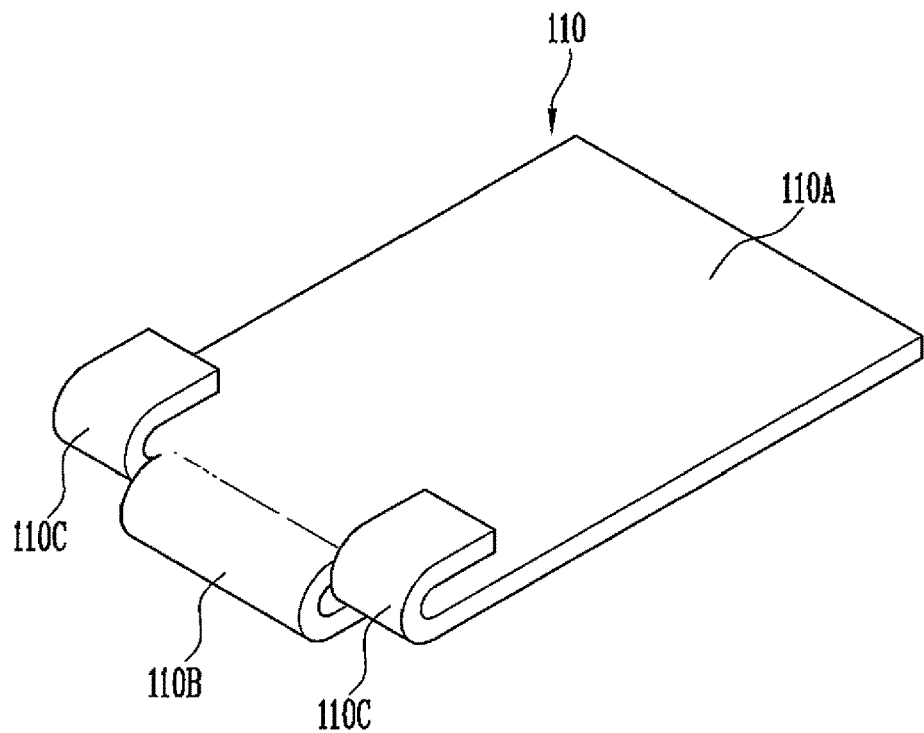

FIGS. 22-23 are perspective views illustrating bent shapes of the first substrate.

Referring to FIGS. 22-23, the first substrate 110 may include a flat area 110A, and a plurality of bent areas 110B and 110C which border the flat area 110A.

The display area (refer to "DA" of FIG. 2) and the first connection pad area (refer to "CPDA" of FIG. 2) may be provided on the flat area 110A. The flat area 110A may have a closed loop shape including linear or curved sides, for example, have a rectangular shape.

The bent areas 110B and 110C may include a first bent area 110B and a second bent area 110C which extend and protrude from one side of the flat area 11A. The first bent area 110B may be an area on which pads for supplying signals to the drive layer (refer to "DDL" of FIG. 6) and the optical layer (refer to "OPL" of FIG. 6) are disposed. A plurality of first bent areas 110B may be provided. The second bent area 110C may be an area on which the second connection pad area (refer to "IMPA" of FIG. 2) is provided.

One selected from the first and second bent areas 1106 and 110C may comprise a plurality of bent areas. For example, as shown in FIG. 22, the first substrate 110 may include two second bent areas 110C that are spaced apart from each other, and the first bent area 1106 may be disposed between the two second bent areas 110C. In some embodiments, as shown in FIG. 23, the first substrate 110 may include two first bent areas 1106 that are spaced apart from each other, and the second bent area 110C may be disposed between the two first bent areas 1106.

The first bent area 1106 and the second bent area 110C may be bent in different directions. For example, the second bent area 110C may be bent toward the second substrate (refer to "120" of FIG. 1) that is disposed on the first substrate 110. The first bent area 1106 may be bent in a direction opposite to the direction in which the second substrate 120 is bent.

As described above, a display device in accordance with the present disclosure is configured such that the size of a conductive ball may be reduced. Therefore, the display device may prevent failure from occurring due to the deviation in size of the conductive ball (or may reduce a likelihood or degree of such contact failure).

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:
    a first substrate comprising a first base substrate, a drive layer on the first base substrate, and an optical layer on the drive layer and having a display element, the first substrate being divided into a display area comprising a pixel area, and a non-display area adjacent to the display area, having a first connection pad and a second connection pad in the non-display area; and
    a second substrate facing the first substrate, and comprising: a second base substrate comprising a sensing area corresponding to the display area, and a non-sensing area corresponding to the non-display area; and a touch sensor on the second base substrate,
    wherein the touch sensor comprises a touch sensing electrode in the sensing area, a touch pad in the non-sensing area, and a sensing line electrically coupling the touch sensing electrode with the touch pad, and
    wherein the non-display area of the first substrate is bent so that the first connection pad and the second connection pad are electrically coupled with each other, and the second connection pad is electrically coupled with the touch pad.

2. The display device according to claim 1, wherein the second connection pad comprises:
    a first pattern on a surface of the first base substrate on which the first connection pad is located;
    a second pattern in a through hole passing through the first base plate, and coupled with the first pattern; and
    a third pattern on a surface of the first base substrate that is opposite to the surface thereof on which the first pattern is located, the third pattern being coupled with the second pattern.

3. The display device according to claim 2, wherein, when the first substrate is bent, the first pattern faces the first connection pad, and the third pattern faces the touch pad.

4. The display device according to claim 3, further comprising:
    a conductive ball between the first pattern and the first connection pad.

5. The display device according to claim 4, further comprising:
    a conductive ball between the third pattern and the touch pad.

6. The display device according to claim 5, wherein a size of the conductive ball between the first pattern and the first connection pad is equal to or greater than a size of the conductive ball between the third pattern and the touch pad.

7. The display device according to claim 5, wherein a size of the conductive ball between the third pattern and the touch pad is equal to or greater than a size of the conductive ball between the first pattern and the first connection pad.

8. The display device according to claim 3, further comprising:
a conductive adhesive layer between the first pattern and the first connection pad.

9. The display device according to claim 8, wherein the conductive adhesive layer comprises conductive paste.

10. The display device according to claim 3, wherein the first pattern and the first connection pad directly contact each other.

11. The display device according to claim 3, further comprising:
a conductive adhesive layer between the third pattern and the touch pad.

12. The display device according to claim 11, wherein the conductive adhesive layer comprises conductive paste.

13. The display device according to claim 3, wherein the third pattern and the touch pad directly contact each other.

14. The display device according to claim 1, wherein the second connection pad comprises:
a first pattern having a shape extending from the first connection pad;
a second pattern in a through hole passing through the first base plate, and coupled with the first pattern; and
a third pattern on a surface of the first base substrate that is opposite to a surface thereof on which the first pattern is located, the third pattern being coupled with the second pattern.

15. The display device according to claim 14, wherein, when the first substrate is bent, the first pattern faces the first connection pad, and the third pattern faces the touch pad.

16. The display device according to claim 15, further comprising:
an elastic member between the first pattern and the first connection pad, and configured to maintain a bent shape of the first substrate.

17. The display device according to claim 16, further comprising:
a conductive ball or a conductive adhesive layer between the third pattern and the touch pad.

18. The display device according to claim 1, wherein, before the first substrate is bent, the first connection pad and the second connection pad are spaced apart from each other.

19. The display device according to claim 18, wherein the first connection pad is between the display area and the second connection pad.

20. The display device according to claim 19, wherein the first substrate comprises:
a flat area;
at least one first bent area extended and bent from one side of the flat area; and
at least one second bent area spaced apart from the first bent area and bent in a direction different from a direction in which the first bent area is bent.

21. The display device according to claim 20, wherein the second connection pad is in the first bent area.

22. The display device according to claim 20,
wherein the first substrate comprises one first bent area, and two second bent areas spaced apart from each other, and
wherein the first bent area is between the second bent areas.

23. The display device according to claim 20,
wherein the first substrate comprises two first bent areas spaced apart from each other, and one second bent area, and
wherein the second bent area is between the first bent areas.

24. The display device according to claim 20, wherein the first connection pad is in the flat area.

25. The display device according to claim 1, further comprising:
an adhesion layer on the first substrate and the second substrate and configured to adhere the first substrate and the second substrate to each other.

26. The display device according to claim 1, further comprising:
an insulating layer between the second base substrate and the touch sensor.

* * * * *